US008207693B2

(12) United States Patent
Hauser et al.

(10) Patent No.: US 8,207,693 B2
(45) Date of Patent: Jun. 26, 2012

(54) CONTROLLER ASSEMBLIES FOR ELECTRIC DRIVE UTILITY VEHICLES

(75) Inventors: Raymond Hauser, Sullivan, IL (US); Christopher K. Wyatt, Windsor, IL (US); Michael Todd, Sullivan, IL (US); Donald Rousser, Sullivan, IL (US); Ivan E. Fox, Mattoon, IL (US); Josh Butler, Mattoon, IL (US)

(73) Assignee: Hydro-Gear Limited Partnership, Sullivan, IL (US)

( * ) Notice: Subject to any disclaimer, the term of this patent is extended or adjusted under 35 U.S.C. 154(b) by 630 days.

(21) Appl. No.: 12/367,144

(22) Filed: Feb. 6, 2009

(65) Prior Publication Data

US 2009/0201650 A1    Aug. 13, 2009

Related U.S. Application Data

(63) Continuation-in-part of application No. 12/209,120, filed on Sep. 11, 2008.

(60) Provisional application No. 60/971,419, filed on Sep. 11, 2007.

(51) Int. Cl.
*H02P 1/54* (2006.01)
(52) U.S. Cl. .......................................... 318/34; 361/784
(58) Field of Classification Search ................... 318/34, 318/625; 361/784, 748, 679.01, 679.02, 361/614, 616, 601, 606
See application file for complete search history.

(56) References Cited

U.S. PATENT DOCUMENTS

| | | | |
|---|---|---|---|
| 3,914,938 A | 10/1975 | Cornell et al. | |
| 4,568,866 A * | 2/1986 | Floro et al. | 318/696 |
| 4,686,434 A | 8/1987 | Kojima et al. | |
| 4,769,557 A * | 9/1988 | Houf et al. | 307/147 |
| 5,305,355 A | 4/1994 | Go et al. | |
| 5,381,314 A * | 1/1995 | Rudy et al. | 361/712 |
| 5,406,778 A | 4/1995 | Lamb et al. | |
| 5,542,251 A | 8/1996 | Leibing et al. | |
| 5,619,111 A * | 4/1997 | Katagiri et al. | 318/625 |
| 5,735,407 A * | 4/1998 | Kallio | 206/707 |
| 5,794,422 A | 8/1998 | Reimers et al. | |
| 5,823,798 A * | 10/1998 | Zintler et al. | 439/76.2 |
| 5,912,801 A * | 6/1999 | Roy et al. | 361/690 |
| 5,934,051 A | 8/1999 | Hahn | |
| 5,975,736 A * | 11/1999 | Simmons et al. | 700/3 |
| 6,082,084 A | 7/2000 | Reimers et al. | |
| 6,109,009 A | 8/2000 | Benson | |
| 6,242,873 B1 | 6/2001 | Drodz et al. | |

(Continued)

FOREIGN PATENT DOCUMENTS

DE    42 24 359 C1    5/1993

(Continued)

OTHER PUBLICATIONS

Tractors: Specifications; Electric Lawn Tractors and Conversion Kits; Nov. 19, 2006; http://electriclawntractor.com.

(Continued)

*Primary Examiner* — Rina Duda
(74) *Attorney, Agent, or Firm* — Neal, Gerber & Eisenberg LLP

(57) ABSTRACT

Controller assemblies and packaging for electronic control systems of electric motors utilized in utility vehicles or other power equipment. Features of the controller assemblies and packaging described herein allow for, among other things, modularity, scalability, and improved heat transfer.

18 Claims, 19 Drawing Sheets

U.S. PATENT DOCUMENTS

| | | |
|---|---|---|
| 6,326,747 B1 | 12/2001 | Shiba et al. |
| 6,388,879 B1 * | 5/2002 | Otaguro et al. ............... 361/695 |
| 6,431,879 B2 * | 8/2002 | Brekosky et al. ............... 439/74 |
| 6,486,632 B2 | 11/2002 | Okushima et al. |
| 6,523,334 B1 | 2/2003 | Dettmann |
| 6,609,357 B1 | 8/2003 | Davis et al. |
| 6,625,498 B1 | 9/2003 | Kurakake et al. |
| 6,864,646 B2 | 3/2005 | Rahman et al. |
| 7,007,446 B2 | 3/2006 | Dettmann |
| 7,017,327 B2 | 3/2006 | Hunt et al. |
| 7,035,115 B2 * | 4/2006 | Walesa ............... 361/788 |
| 7,075,796 B1 * | 7/2006 | Pritchett ............... 361/796 |
| 7,126,237 B2 | 10/2006 | Walters et al. |
| 7,280,356 B2 * | 10/2007 | Pfahnl et al. ............... 361/695 |
| 7,610,975 B1 * | 11/2009 | Gust et al. ............... 180/65.245 |
| 7,688,573 B2 * | 3/2010 | Ranta ............... 361/645 |
| 7,815,546 B2 | 10/2010 | Jagodzinski |
| 2004/0124026 A1 | 7/2004 | Walters et al. |
| 2004/0160201 A1 | 8/2004 | Rahman et al. |
| 2006/0059879 A1 | 3/2006 | Edmond |
| 2007/0204827 A1 | 9/2007 | Kishibata et al. |
| 2008/0234096 A1 | 9/2008 | Joshi et al. |
| 2008/0289309 A1 | 11/2008 | Gust et al. |
| 2009/0000839 A1 | 1/2009 | Ishii et al. |
| 2009/0065273 A1 | 3/2009 | Wyatt et al. |
| 2009/0069964 A1 | 3/2009 | Wyatt et al. |

FOREIGN PATENT DOCUMENTS

| | | |
|---|---|---|
| DE | 10148326 A1 | 4/2003 |
| EP | A 0 151 208 | 8/1985 |
| EP | A-0 151 208 | 8/1985 |
| EP | 1151892 A3 | 11/2001 |
| EP | 1228917 A | 8/2002 |
| EP | 1327547 A | 7/2003 |
| EP | 1645456 A3 | 7/2006 |
| JP | 2001-320807 A | 11/2001 |
| JP | 2003-291692 A | 10/2003 |
| JP | 2004-100718 A | 4/2004 |
| JP | 2007-037366 A | 2/2007 |
| WO | WO 2006/039520 A1 | 4/2006 |
| WO | WO 2006/039521 A1 | 4/2006 |
| WO | WO2009/036208 A1 | 3/2009 |
| WO | WO2009/036211 A2 | 3/2009 |
| WO | WO 2009/036211 A3 | 3/2009 |
| WO | WO 2010/048561 A2 | 4/2010 |

OTHER PUBLICATIONS

Edmond Electric Company Ltd.; Patent Pending, Tested and Proven Design . . . ;Electric Lawn Tractors and Conversion Kits—Patent Pending, Tested and Poven Design;Apr. 25, 2007; pp. 1-2; http://electriclawntractor.com/index.php?option=com_content&task=view&id=19&Itemid . . . .

Jacobsen, A Textron Company; Jacobsen E-Plex II, Riding Greens Mowers; pp. 1.2; Version 3.0, Jan. 2007.

Jacobsen, A Textron Company; Jacobsen E-Walk, Walking Green Mowers, pp. 1-2; Version 3.0; Jan. 2007.

Jacobsen, A Textron Company; The Toro Company, Mid-Duty Specifications: Electric e2065 Workman; Toro-Golf Course Management Workman, Apr. 24, 2007; http://www.toro.com/golf/vehicle/workman/midduty/e2065_specs.html.

International Search Report and Written Opinion of the International Searching Authority issued on Mar. 12, 2008 in connection with PCT/US2008/07606.

International Search Report and Written Opinion of the International Searching Authority issued on Mar. 20, 2009 in connection with PCT/US2008/076072.

International Search Report and Written Opinion of the International Searching Authority dated Jun. 4, 2010 with respect to International Application No. PCT/US2009/061929.

Republished International Publication No. WO 2009/036211 A3 together with the International Seach Report.

European Office Action issued on Jun. 29, 2009 with regard to European Patent Application No. 07 799 218.8.

Non-Final Office Action issued on Dec. 21, 2011 in related U.S. Appl. No. 12/209,120.

Non-Final Office Action issued on Sep. 29, 2011 in related U.S. Appl. No. 12/209,074.

* cited by examiner

US 8,207,693 B2

CONTROLLER ASSEMBLIES FOR ELECTRIC DRIVE UTILITY VEHICLES

RELATED APPLICATIONS

This application is a continuation-in-part of U.S. patent application Ser. No. 12/209,120 filed on Sep. 11, 2008, which claims priority to U.S. Provisional Patent Application No. 60/971,419, filed Sep. 11, 2007. These prior applications are incorporated herein in their entirety by reference.

TECHNICAL FIELD

This disclosure is generally related to utility vehicles, such as lawn and garden tractors and mowers, and more particularly to controller assemblies used to control such vehicles.

BACKGROUND OF THE INVENTION

Utility vehicles, such as, for example, lawn and garden tractors and mowers, have traditionally relied upon internal combustion engines as the prime mover transferring power through mechanical linkages. Alternatively, some utility vehicles have employed electric power supplies to provide power to one or more electric motors that may directly or indirectly drive one or more vehicle wheels to propel the vehicle. All of these vehicles incorporate various forms and levels of control, depending upon the vehicle type, drive type, their functional features, and other design aspects. Electric drive utility vehicles have emerged as viable alternatives to internal combustion utility vehicles, particularly due to rising oil and fuel prices. With the advancement of these vehicle types and their functionality, various problems and needs have arisen or remain unresolved.

This disclosure is directed to addressing various problems and needs in the general area of utility vehicle control system packaging and assemblies.

SUMMARY OF THE INVENTION

Controller assemblies and packaging for electronic control systems of electric motors utilized in utility vehicles or other power equipment are disclosed. Features of the controller assemblies and packaging described herein allow for, among other things, modularity, scalability, and improved heat transfer. The flexibility inherent in the controller assemblies provides for a variety of control system solutions applicable across a wide variety of utility vehicle drive and auxiliary work functions.

A better understanding of the objects, advantages, features, properties and relationships of the invention will be obtained from the following detailed description and accompanying drawings which set forth one or more illustrative embodiments which are indicative of the various ways in which the principles of the invention may be employed.

DETAILED DESCRIPTION OF THE DRAWINGS

Figure 1:
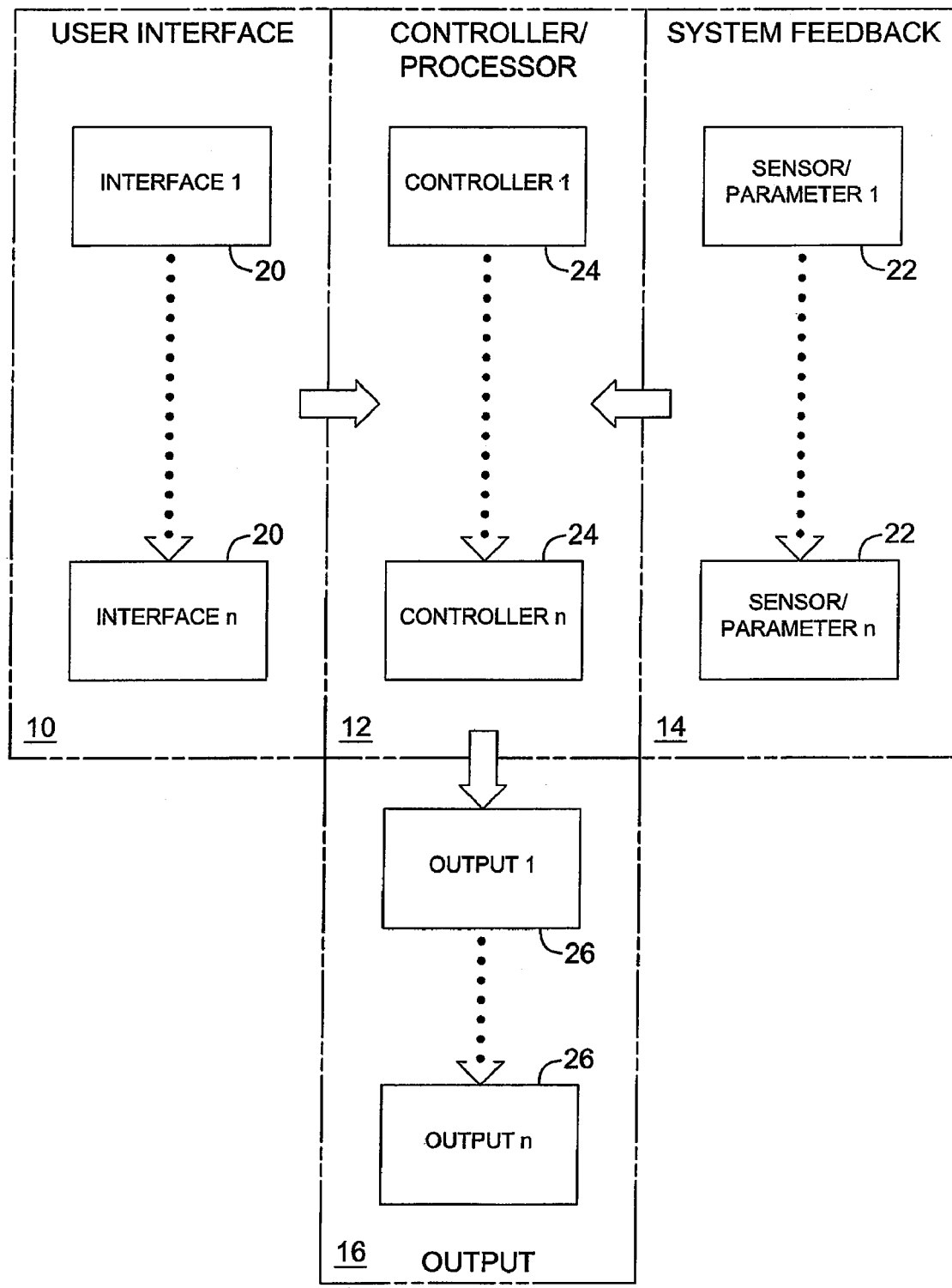
FIG. 1 is a block diagram depicting an overview of general control system architecture applicable to a vehicle contemplated by the principles of the present invention.

The description that follows describes, illustrates and exemplifies one or more embodiments of the present invention in accordance with its principles. This description is not provided to limit the invention to the embodiments described herein, but rather to explain and teach the principles of the invention in order to enable one of ordinary skill in the art to understand these principles and, with that understanding, be able to apply them to practice not only the embodiments described herein, but also other embodiments that may come to mind in accordance with these principles. The scope of the present invention is intended to cover all such embodiments that may fall within the scope of the appended claims, either literally or under the doctrine of equivalents.

It should be noted that in the description and drawings, like or substantially similar elements may be labeled with the same reference numerals. However, sometimes these elements may be labeled with differing numbers, such as, for example, in cases where such labeling facilitates a more clear description. Additionally, the drawings set forth herein are not necessarily drawn to scale, and in some instances proportions may have been exaggerated to more clearly depict certain features. Such labeling and drawing practices do not necessarily implicate an underlying substantive purpose. As stated above, the present specification is intended to be taken as a whole and interpreted in accordance with the principles of the present invention as taught herein and understood by one of ordinary skill in the art.

It should also be noted that references herein to specific manufactured components may be provided as preferred embodiments or exemplifications and should not be construed as limiting. In each case, similar or equivalent components from other manufacturers may be utilized as well.

As referenced in FIG. 1, control systems for utility vehicles typically incorporate elements from four functional segments: a user interface segment 10, a controller/processor segment 12, a system feedback segment 14, and an output segment 16. Utility vehicles may incorporate one or more user interfaces 20, such as, for example, a steering wheel or steering/drive levers, an accelerator or other control pedal, a brake pedal or lever, a bypass switch, a PTO switch, visual displays, meters, etc. These user interfaces fall into one of two categories; input interfaces, such as a steering wheel, and feedback interfaces, such as a battery meter. Utility vehicles may also incorporate one or more sensors or feedback architectures 22, such as, for example, speed sensors, steering sensors, accelerator sensors, temperature sensors, voltage sensors, current sensors, etc. The sensor(s) 22 and the user interface(s) 20 are in communication with one or more controllers/processors 24 of the system. The controller(s) 24 utilize inputs from one or more of the user interface(s) 20 and sensor(s) 22 in algorithmic processes to provide one or more appropriate outputs 26 to various components of the vehicle. Output(s) 26 may include, for example, control and operational signals for one or more auxiliary devices, such as a motor for a mower blade or other implement, control and operational signals for one or more primary movers, such as an electric drive motor, control signals to one or more additional controllers, control signals to one or more drivers, signal outputs to user interfaces such as visual displays or meters, etc.

Figure 2:
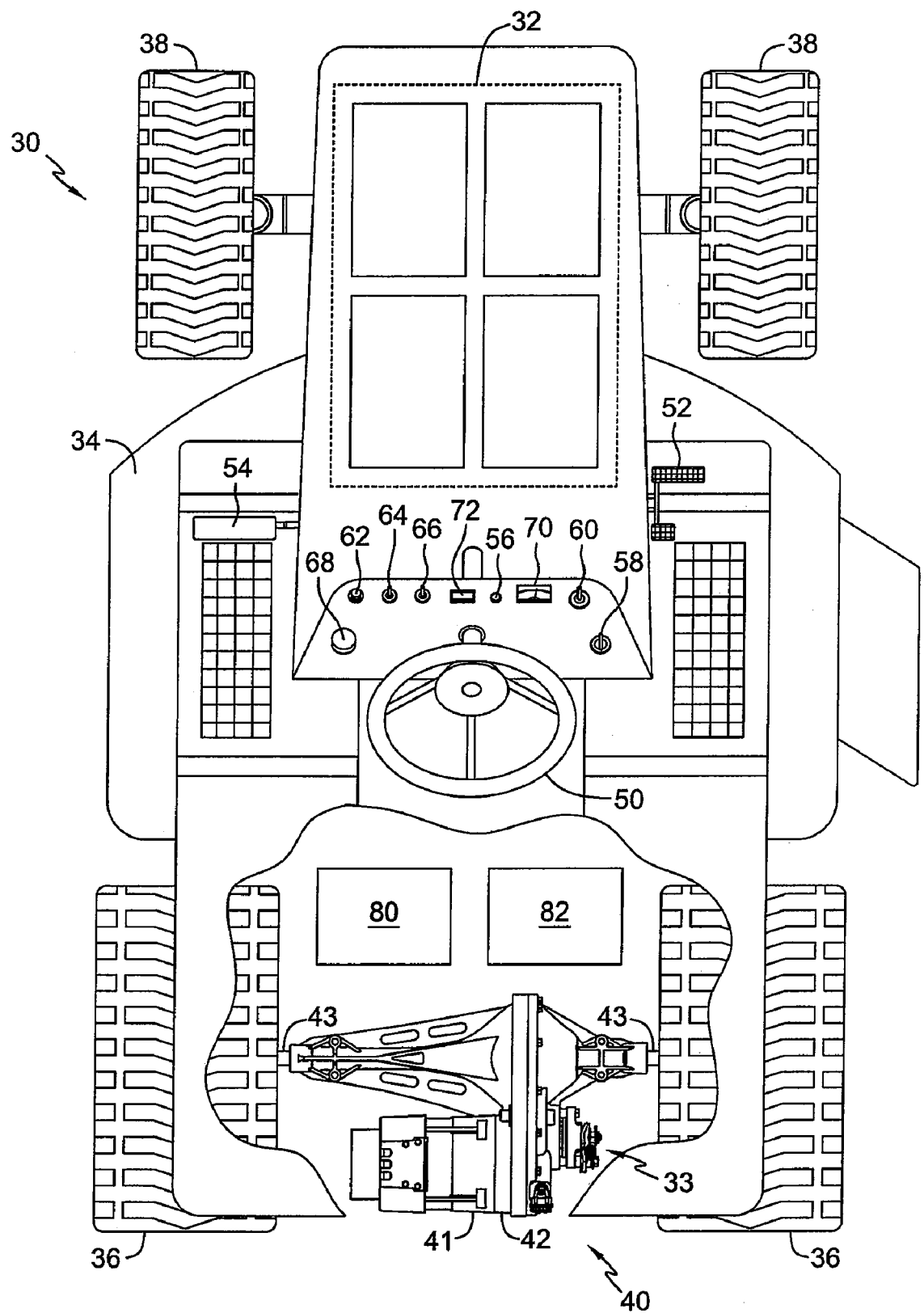
FIG. 2 is a top plan view of a first embodiment of a vehicle in the form of a riding lawn mower to which one or more principles or aspects of the present invention may be applied.

FIG. 2 illustrates a first embodiment of a utility vehicle in the form of mowing vehicle 30, which incorporates one or more principles of the present invention. While all of the vehicles depicted herein for purposes of exemplification are lawn mowing vehicles, it should be understood that the principles of the present invention may be applied to other vehicles as well, such as, for example, utility vehicles, tractors, snow throwers, or the like. Referring to FIG. 2, vehicle 30 includes a power supply 32, a mower deck 34, a pair of driven wheels 36 and a pair of steered wheels 38. In an alternate embodiment (not shown), a single steered wheel may be used. In the embodiment shown, vehicle 30 also includes a single electric transaxle 40, which includes an electric drive motor 41 and associated transmission 42, that drives a pair of output or axle shafts 43, which in turn drive a pair of wheels 36 that provide motion to vehicle 30. It should be noted that the use of the term wheel is intended to cover all types of wheels, as well as gears, linkages, or other mechanisms that may ultimately translate into a traction implement, such as, for example, an inner wheel of a track arrangement on a track vehicle. As shown in FIG. 2, vehicle 30 includes user interfaces, such as steering wheel 50, accelerator pedal 52, brake pedal 54, an indicator LED or lamp 56, vehicle key switch 58, power take-off (PTO) switch 60, cruise switch 62, reverse operating system (ROS) switch 64, brake switch 66, emergency stop switch 68, battery gauge 70 and hour meter 72.

In the embodiment illustrated in FIG. 2, vehicle 30 incorporates a traction controller 80 and an auxiliary controller in the form of deck controller 82 as part of the control system. In this particular embodiment, the traction controller 80 controls electric transaxle 40 and, when certain operational conditions are met, allows the operator of vehicle 30 to close PTO switch 60 to energize or allow activation of one or more functional outputs controlled by deck controller 82. These functional outputs may include a variety of auxiliary equipment such as mower deck 34 (illustrated), or in other embodiments, a snow thrower, a tiller, sweeper brooms, or other implements. In the illustrated embodiment, controller terminal and pin identifiers, such as A5, A6, B7, B8, etc., are shown for reference only. Other circuit arrangements/pin assignments are possible. Alternatively, many other types of processors, inverters, programmable logic controllers (PLCs), or the like could be utilized in accordance with the principles of the present invention. Furthermore, in certain embodiments, traction controller 80 and deck controller 82 may each incorporate more than one controller or processor, depending on the architecture implemented and other functional needs.

Figure 3:
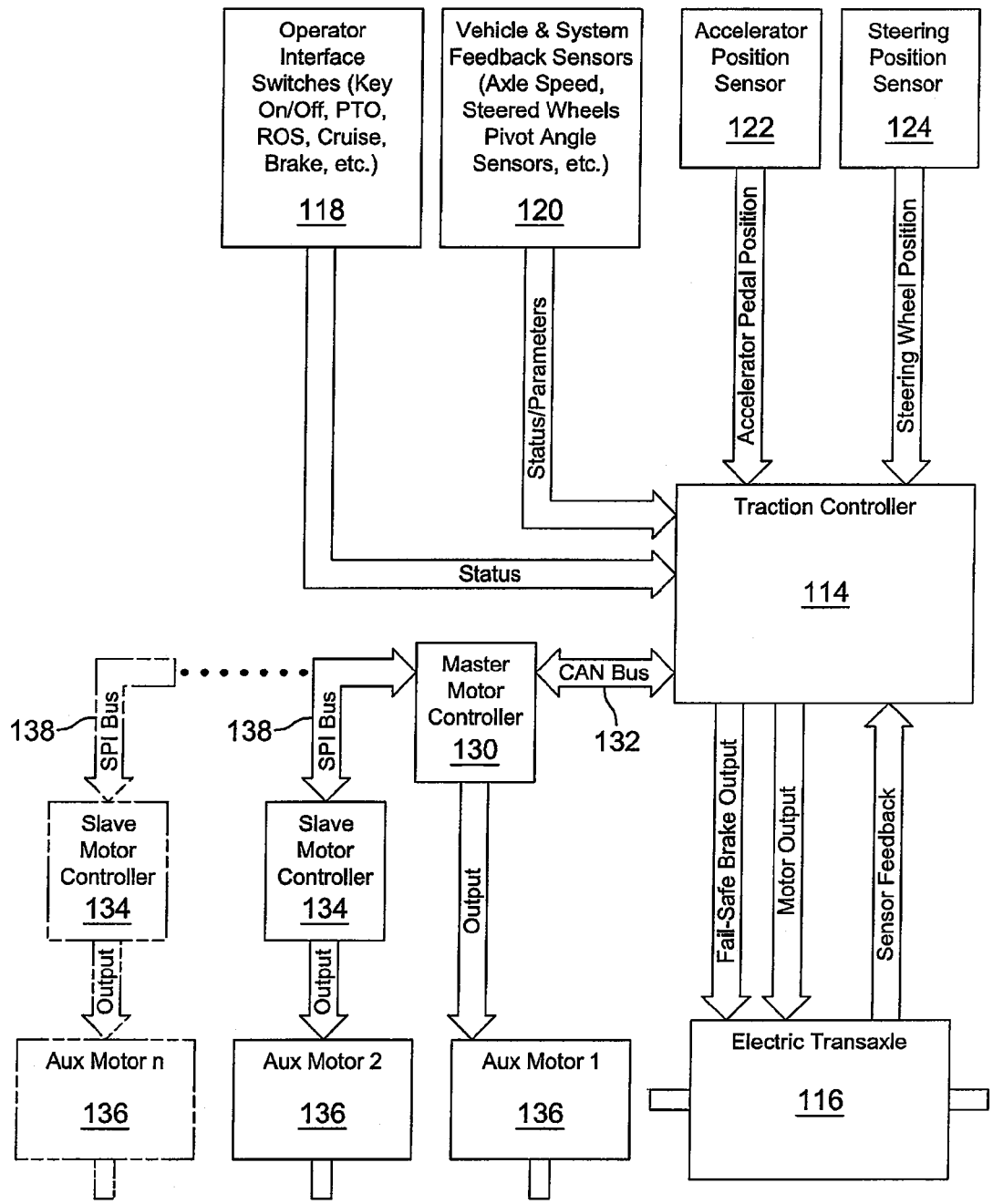
FIG. 3 is a block diagram of an embodiment of a control system applicable to a vehicle such as the vehicle depicted in FIG. 2.

FIG. 3 illustrates an embodiment of the functional relationship and communication between various components of a control system in accordance with one or more principles of the present invention, which can be adapted to vehicle 30 of FIG. 2 or similar vehicles. In this particular embodiment, a traction controller 114 is implemented to control functional aspects of an electric transaxle 116. Traction controller 114 is in communication with a plurality of user/operator interfaces 118, as well as vehicle and system feedback sensors 120, accelerator position sensor 122, and steering position sensor 124. The traction controller 114 is also in communication with a master auxiliary controller 130, preferably via a CAN (Controller Area Network) bus 132. The master auxiliary controller 130 may incorporate one or more slave controllers 134, depending on the number of auxiliary motors/functions 136 implemented in the vehicle 30 and requiring control. Preferably, each of the slave controllers 134 is in communication with the master controller via an SPI (Serial Peripheral Interface) bus 138. Alternatively, all of the controllers can be configured to communicate directly to the CAN bus.

The auxiliary functions typically incorporate an auxiliary motor. Since vehicle 30 of FIG. 2 is a mowing vehicle, one or more auxiliary motors are used to drive mower blades. As illustrated in FIG. 3, each auxiliary motor incorporated into the system preferably is driven by a separate controller, one of which is driven by the master controller 130 and the remaining motors driven by the one or more slave controllers 134. However, in certain embodiments, a single auxiliary controller may be used to drive multiple motors. In accordance with the system architecture, signals from the vehicle, user interfaces, system sensors, the slave auxiliary controllers, the master auxiliary controller, and the traction controller can be shared to create a fully integrated control system.

Figure 4:
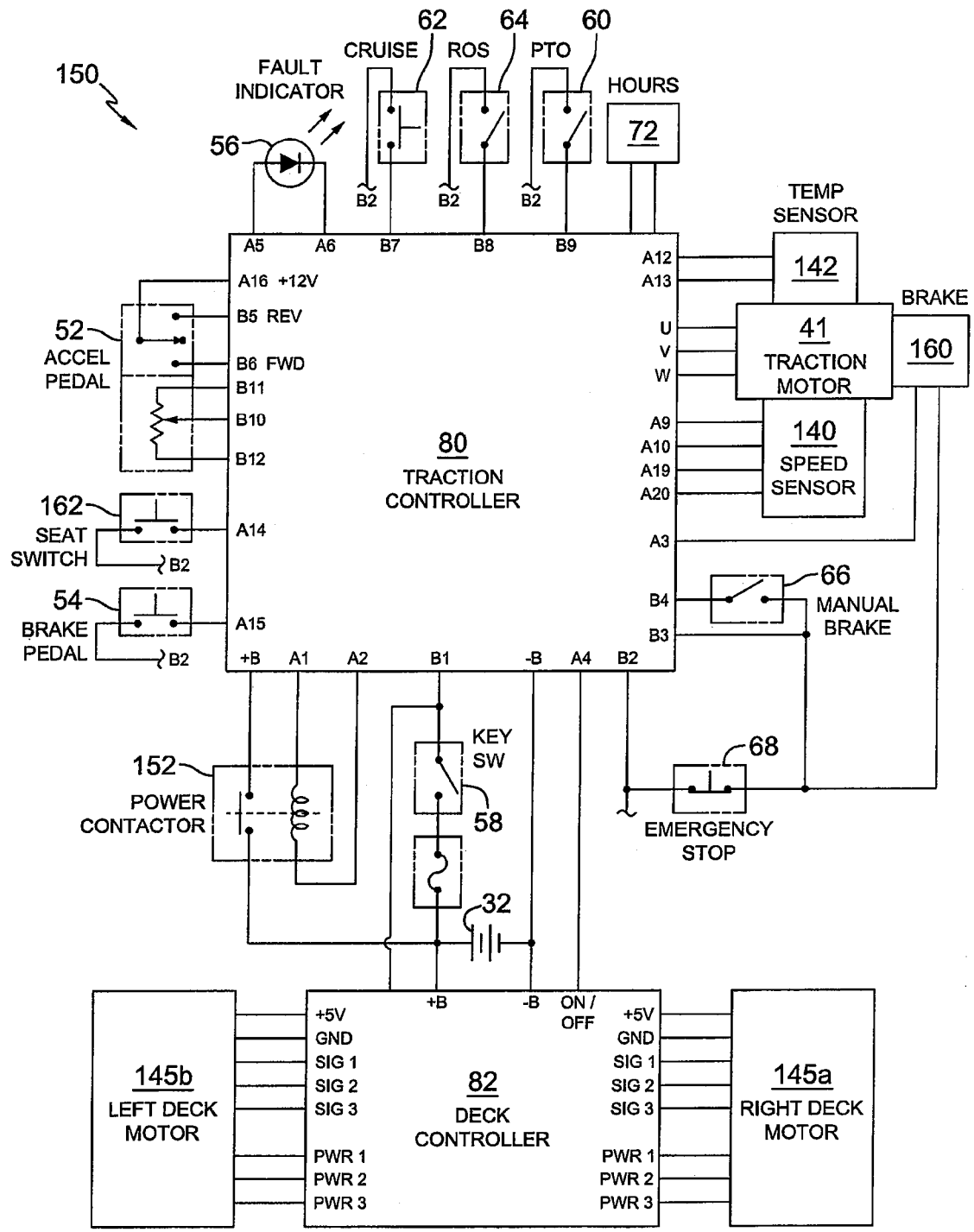
FIG. 4 is a schematic diagram of a specific example of a control system in accordance with the control system depicted in FIG. 3.

FIG. 4 illustrates an exemplary embodiment of a control system 150 for use with vehicle 30 of FIG. 2. Traction controller 80 controls the speed and direction of vehicle 30. Transaxle 40 comprises electric motor 41, transmission 42, and axles 43. The speed of transmission 42 can be adjusted by regulating the voltage frequency supplied to electric motor 41. Feedback used in the control of vehicle 30 is provided to traction controller 80 by speed sensor 140 of electric motor 41 (which drives transmission 42).

Speed sensor 140 of electric motor 41 may be a dual Hall Effect sensor that can sense and signal both a change in acceleration and rotation direction of electric motor 41. Feedback from speed sensor 140 enables execution of programming of desired characteristics of acceleration, deceleration, neutral, and change in direction via control software in connection with traction controller 80. The flexibility of programming allows features such as, for example, a panic stop ramped deceleration function, custom acceleration/deceleration curves, or other programmable functions to be implemented.

Electric motor 41 may be protected from damage by over-current and over-voltage sensors or circuitry (not shown) located in traction controller 80. MOSFETs (metal-oxide-semiconductor field-effect transistors) located within controller 80 are protected by the controller's capability to monitor current and temperature. A temperature sensor 142 may be located in electric motor 41 to protect electric motor 41 from overheating. Feedback from these sensors may be used to perform system checks, regulate vehicle speed, disable the PTO, initiate a controlled shutdown, sound or display a warning, or perform other functions relating to the vehicle. Additionally, in a particular embodiment, vehicle 30 may be driven in a forward or reverse direction by operator control of accelerator pedal 52, which may be a "rocker style", heel and toe operated pedal that includes one or more associated or integrated switches to signal direction and a potentiometer (or other signal-generating device) to signal desired speed to traction controller 80. Optionally, a separate F-N-R (Forward-Neutral-Reverse) switch could be employed, which is used in conjunction with a simple accelerator pedal that signals desired speed only. In yet another embodiment (not shown), two separate pedals could be used for forward and reverse directions of vehicle movement. This option allows manufacturers flexibility in choosing traditional operator controls or a different configuration.

A wiring harness or assembly electrically connects the various elements of control system 150. Wiring harness(es) may be configured so that wires carrying signals are grouped together and wires carrying power and drive signals are grouped together with appropriate shielding for signal integrity. As shown in FIG. 4, deck controller 82 is in communication with traction controller 80 and controls a pair of deck motors 145a and 145b (which may be referred to herein collectively as deck motors 145).

As shown in FIGS. 2 and 4, power supply 32 is provided to operate one or more systems of vehicle 30, including components of control system 150. In the embodiment shown, power supply 32 consists of four 12V batteries providing 48V power. Power is distributed from power supply 32, through power contactor 152 to traction controller 80. In the embodiment shown, power contactor 152 is a model SW60 contactor manufactured by Albright International, Ltd. of Surbiton, UK (England). Power supply 32 is also in electrical communication with on-off key switch 58. With key switch 58 in an ON position, and with the presence of power at a specified voltage threshold from power supply 32, power contactor 152 enables traction controller 80 after diagnostic checks verify that traction controller 80 is ready to run.

Referring again to FIGS. 2 and 4, movement of rocker style accelerator pedal 52 (or other accelerator mechanism) signals traction controller 80 of an operator-directed acceleration or deceleration of vehicle 30 in either the forward or reverse direction. The input signals from accelerator pedal 52 determine the direction and speed of operation of transaxle 40.

As explained above, vehicle 30 includes operator interfaces, switches, sensors, and other components that interact within the control system to effectuate control of vehicle 30. In addition to fail-safe brake 160, which is integral to electric motor 41 and actuated automatically when vehicle 30 is stopped, brake pedal 54 may be used to actuate an additional dynamic or parking brake 33 located as part of transaxle 40 or as a separate device. In the illustrated embodiment, steering wheel 50 facilitates turning of vehicle 30 by mechanical, electro-mechanical or other known methods of controlling positioning of steered wheels 38. Other steering interfaces could be employed as well, such as steering/drive levers (shown in FIGS. 5 and 6), joystick control, or the like. A seat switch 162 is employed to detect the presence of a user in the seat of the vehicle and can be used as part of a systems check.

Figure 5:
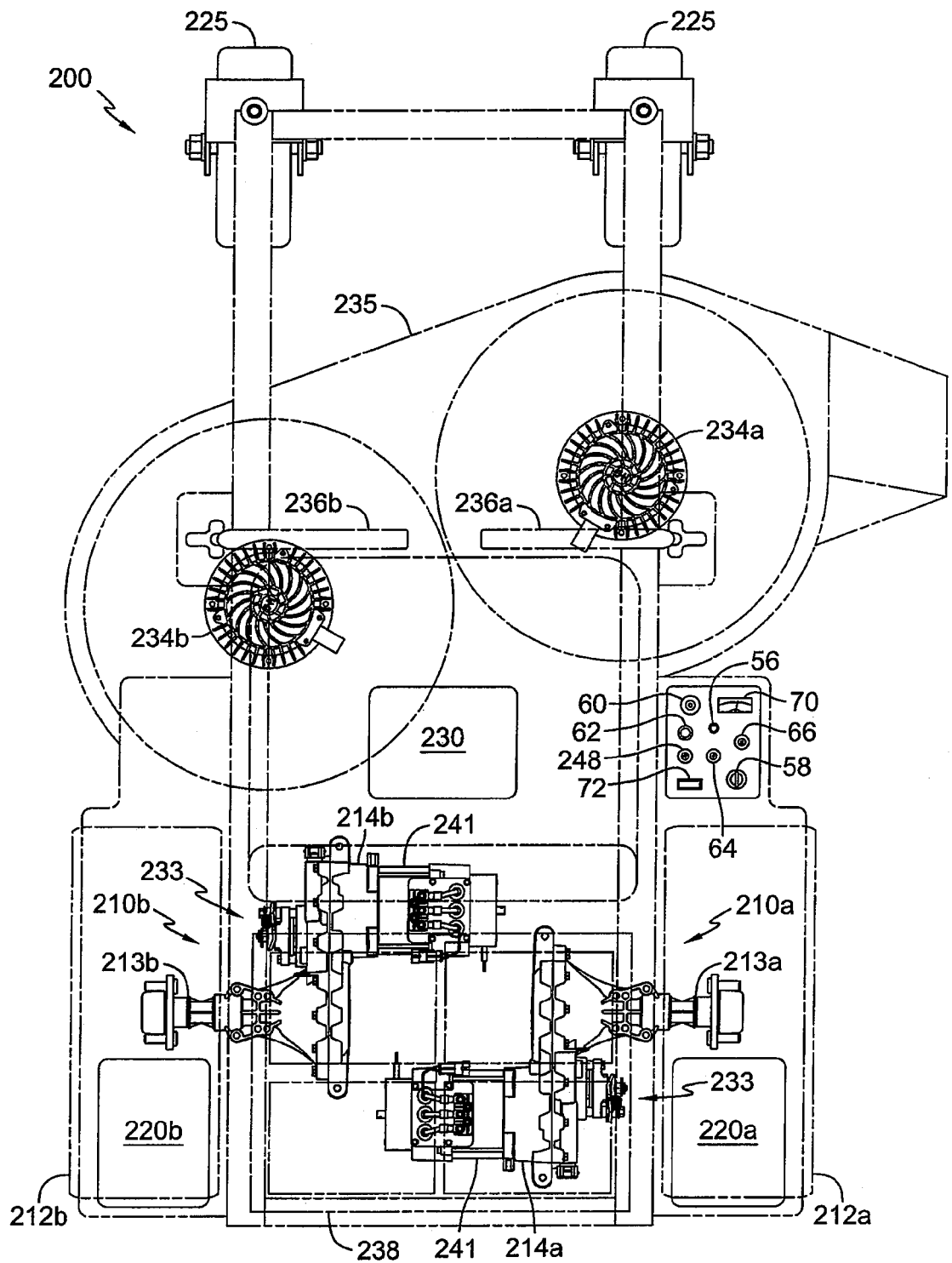
FIG. 5 is a top plan view of a second embodiment of a vehicle in the form of a riding lawn mower to which one or more principles or aspects of the present invention may be applied.

FIG. 5 illustrates a second embodiment of a utility vehicle in the form of mowing vehicle 200, which incorporates one or more principles of the present invention. Power supply 238 of vehicle 200 drives an electric motor 241 on each of two electric transaxles, 210a and 210b, each separately driving one of two rear wheels 212a and 212b, to implement zero turn vehicle functionality. A pair of pivoting front casters 225 is also provided to facilitate zero turn vehicle functionality. The transaxles drive the wheels 212a and 212b via axle shafts 213a and 213b (which may be referred to herein collectively as axle shafts 213), which are coupled to transmissions 214a and 214b, which are driven by electric motors 241. In this embodiment, the electric transaxles 210a and 210b are nested in a side-by-side, parallel arrangement as shown in FIG. 5.

Figure 8:
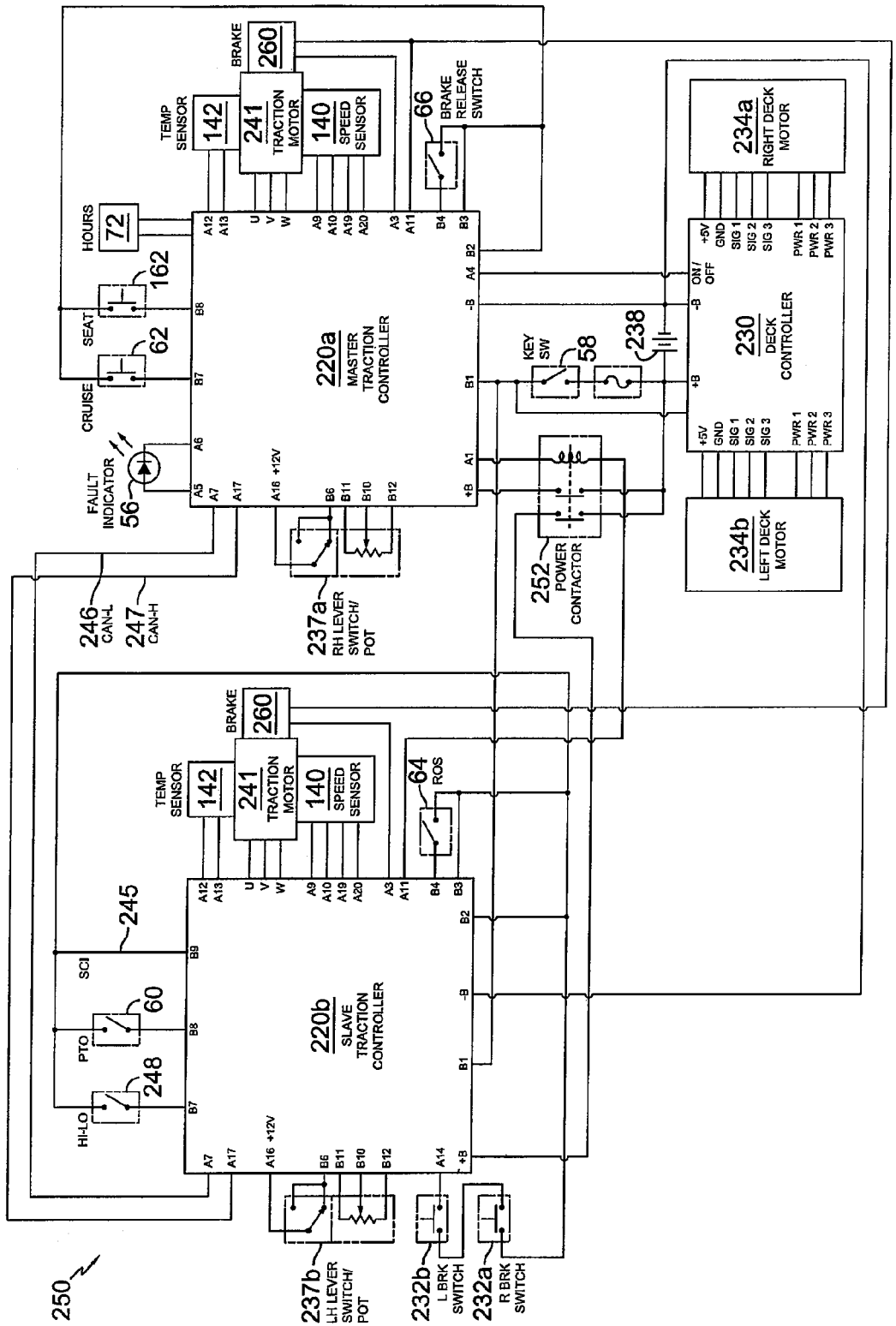
FIG. 8 is a schematic diagram of a specific example of a control system in accordance with the control system depicted in FIG. 7.

As shown in FIGS. 5 and 8, power supply 238 is provided to operate one or more systems of vehicle 200, including components of the control system 250. Power is distributed from power supply 238, through double-pole power contactor 252, to traction controllers 220a and 220b. In the embodiment shown, power contactor 252 may be a model SW68 contactor manufactured by Albright International, Ltd. of Surbiton, UK (England). Power supply 238 is also in electrical communication with on-off key switch 58. With key switch 58 in an ON position, and with the presence of power at a specified voltage threshold from power supply 238, power contactor 252 enables traction controllers 220a and 220b after diagnostic checks verify that traction controllers 220a and 220b are ready to run. An optional Hi-Lo performance switch 248 may be included to control a programmable power management function. Though not shown in FIGS. 2 and 4, this function could also be included for the vehicle represented in those figures. Switch 248 may be used to increase or reduce overall power consumption depending on mowing or travel conditions, thereby giving the vehicle user greater control over vehicle performance and operating characteristics. The Hi-Lo performance switch may also be used to switch between aggressive/non-aggressive operational modes to fit the skill or comfort level of individual vehicle operators. In an alternate embodiment (not shown), multiple user settings may be programmed and available to users via code entry, menu and/or password entry or multiple switch positions. Additional programmable features may also include password-enabled parental or vehicle manager controls which either prevent children or unauthorized users from operating the vehicle or prevent an authorized user from operating the vehicle in a manner perceived by the vehicle manager to be unsafe. For example, the ROS function could be disabled so that no mowing is allowed in reverse. Or, activation of mower blades and/or other auxiliary equipment could be disabled completely (by disabling specific functions or the auxiliary controller) to allow use of the vehicle simply for transport or to pull a utility cart, for example.

Referring again to FIGS. 5 and 8, mowing vehicle 200 may include one or more brake systems. In the embodiment shown, switches 232a and 232b, activated when steering/drive levers 236a and 236b are both positioned in a neutral, drive-disengaged position, may be used to apply fail-safe brakes 260. Similarly, when drive levers 236a and 236b are both positioned in the neutral, drive-disengaged position, switches 232a and 232b (or a separate set of switches) may also signal or initiate a blade stop function as a safety and power management feature. In addition to this electrically activated fail-safe brake system, an optional mechanically-applied dynamic or parking brake 233 may be included on each transmission 214a and 214b of transaxle 210a and 210b.

Figure 6:
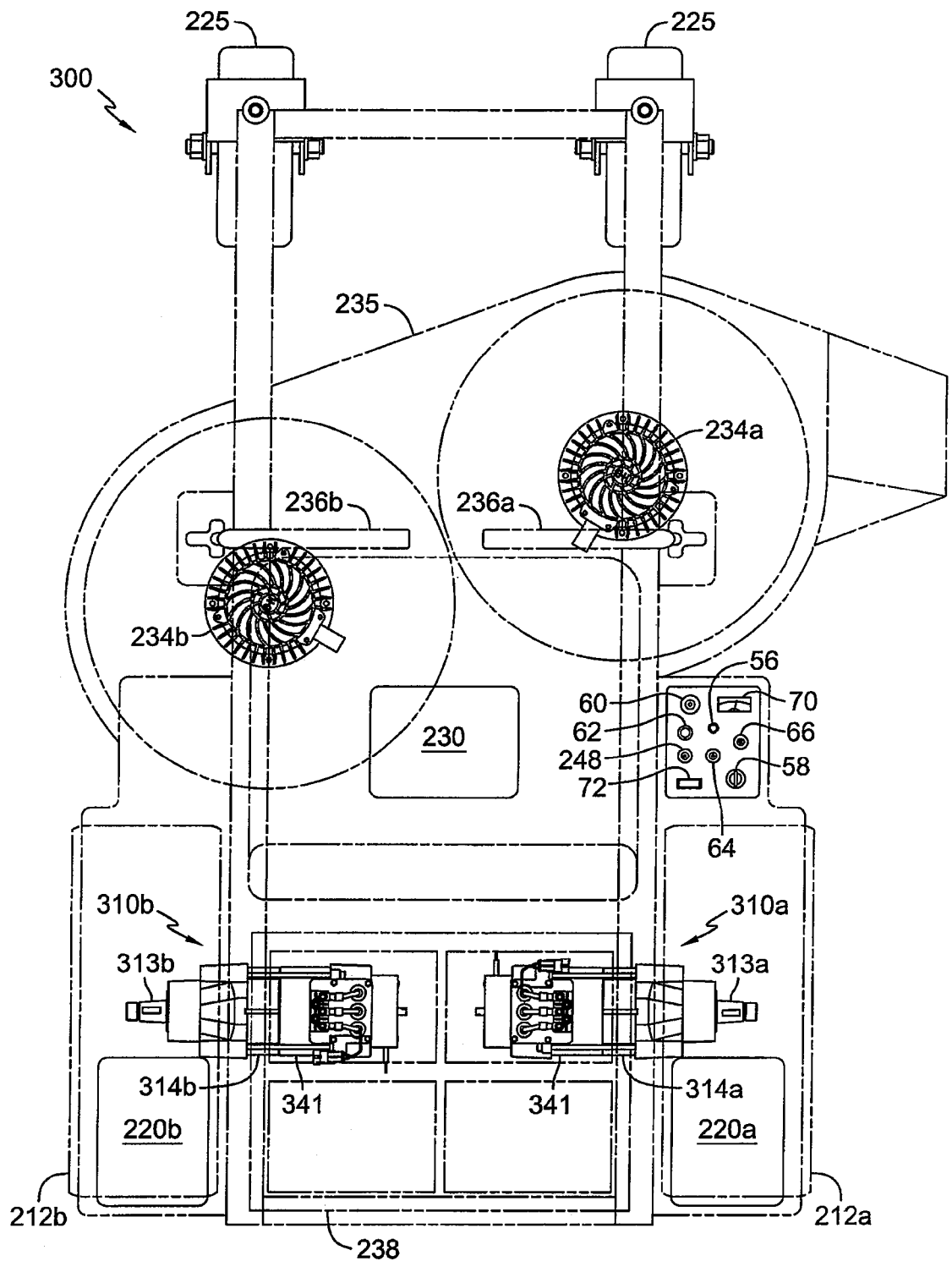
FIG. 6 is a top plan view of a third embodiment of a vehicle in the form of a riding lawn mower to which one or more principles or aspects of the present invention may be applied.

FIG. 6 illustrates a third embodiment of a utility vehicle in the form of mowing vehicle 300, which is controlled in substantially the same manner as vehicle 200 of the second embodiment. Mowing vehicle 300, however, accomplishes zero turn functionality using Electric Planetary Reduction Motors (EPRMs) 310a and 310b. Power supply 238 of vehicle 300 drives an electric motor 341 located on each EPRM 310a and 310b, which in turn drive planetary reduction transmission/gearing 314a and 314b, coupled to axle shafts 313a and 313b, thereby separately driving rear wheels 212a and 212b.

Vehicles 200 and 300 both incorporate a control system employing a master traction controller 220a and a slave traction controller 220b (which may be referred to herein collectively as controllers 220), as well as an auxiliary controller in the form of deck controller 230. Referring to FIG. 5, master traction controller 220a controls transaxle 210a and communicates with slave traction controller 220b by way of a CAN bus represented on FIG. 8 by CAN-L circuit 246 and CAN-H circuit 247. Slave controller 220b controls transaxle 210b and is identified as the slave controller by SCI (Slave Control Identifier) circuit 245. In the embodiments shown in FIGS. 5 and 6, the deck controller 230 controls two deck motors 234a and 234b (which may be referred to herein collectively as deck motors 234) which respectively drive associated mowing blades situated under mowing deck 235. In these particular embodiments, steering interfaces take the form of a right drive lever 236a and a left drive lever 236b (which may be referred to herein collectively as drive levers 236). Associated with these operator-manipulated drive levers are sensors and switches such as, for example, combination position sensor and neutral switches 237a and 237b, which are in communication with controllers 220a and 220b. Referencing FIG. 8, the sensor portion of sensor/switch 237a and 237b is a potentiometer and the switch portion is deactivated as the potentiometer is rotated through a positional zone corresponding to the drive levers 236a and 236b neutral position zones. Sensor switches 237a and 237b may be actuated directly by drive levers 236 or by a mechanical apparatus or linkage interface with drive levers 236.

In an alternate embodiment (not shown), a steering wheel or other steering interface may be utilized and casters 225 may be steered rather than freely pivoting. In certain applications, a defined response of front casters 225 to the action of transaxles 210a and 210b may be desirable. One application in which this may be desirable is a mowing vehicle, which may laterally traverse sloped surfaces in some mowing environments.

Figure 7:
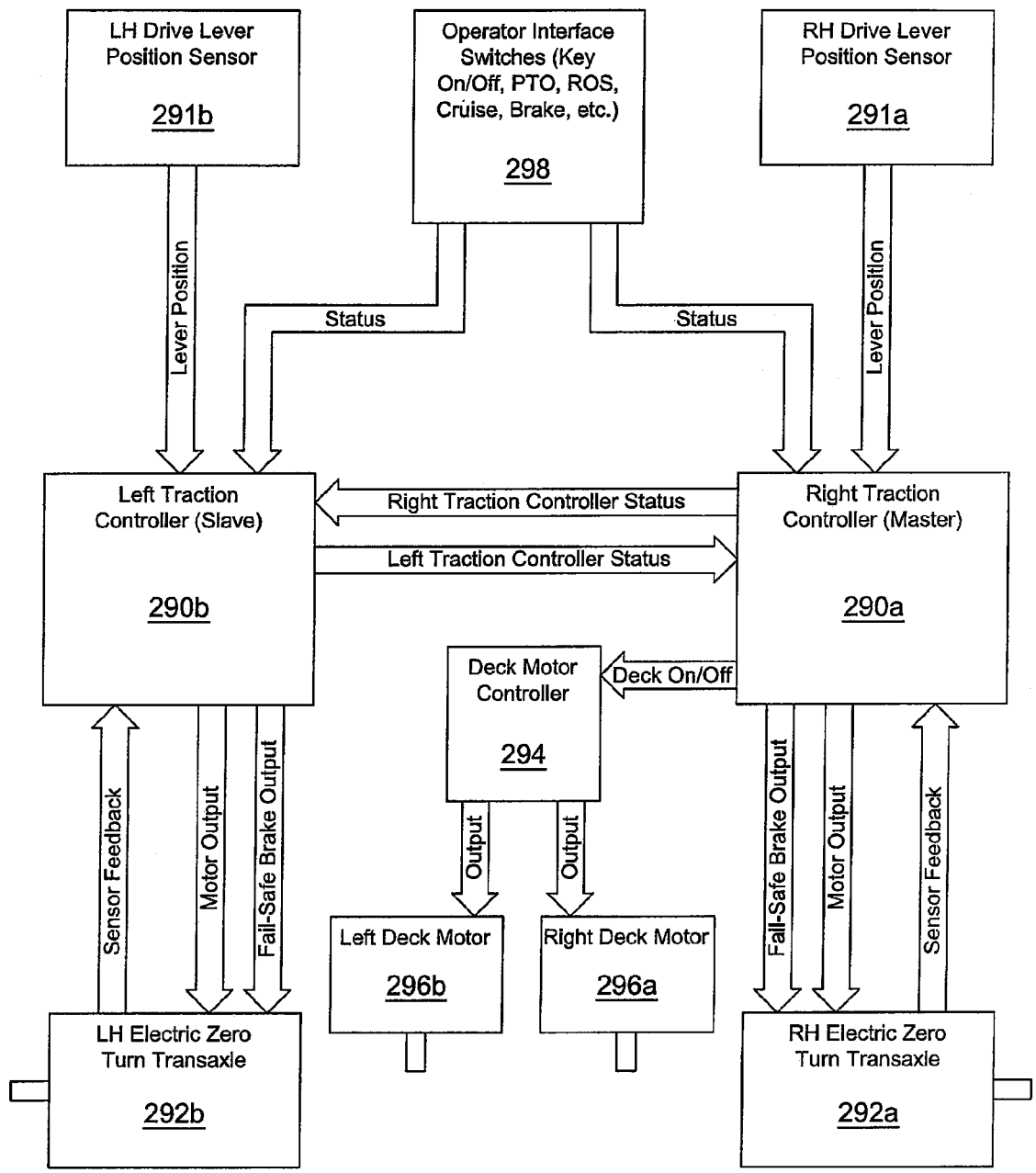
FIG. 7 is a block diagram of an embodiment of a control system applicable to a vehicle such as the vehicles depicted in FIGS. 5 and 6.

FIG. 7 illustrates an embodiment of the functional relationship and communication between various components of a control system in accordance with one or more principles of the present invention, which can be adapted to vehicles 200 and 300. As illustrated in FIG. 7, a master traction controller 290a and a slave traction controller 290b communicate with each other with respect to status and values relating to various components and interfaces of the control system and the vehicle. Preferably, the master and slave traction controllers 290a and 290b communicate via a CAN bus or other bus type or communication standard. Additionally, master traction controller 290a is in direct communication with transaxle 292a and slave traction controller 290b is in direct communication with transaxle 292b. Master traction controller 290a also communicates with a single deck controller 294, which controls right and left deck motors 296a and 296b. A right drive lever position sensor 291a is associated with the right drive lever (reference drive lever 236a, shown in FIGS. 5 and 6) and is in communication with the master traction controller 290a. Similarly, a left drive lever position sensor 291b is associated with the left drive lever (reference drive lever 236b, shown in FIGS. 5 and 6) and is in communication with the slave traction controller 290b. Other operator interfaces 298, such as, for example, key on/off, PTO, ROS, cruise, and brake, are in communication with traction controllers 290a and 290b.

Figure 9:
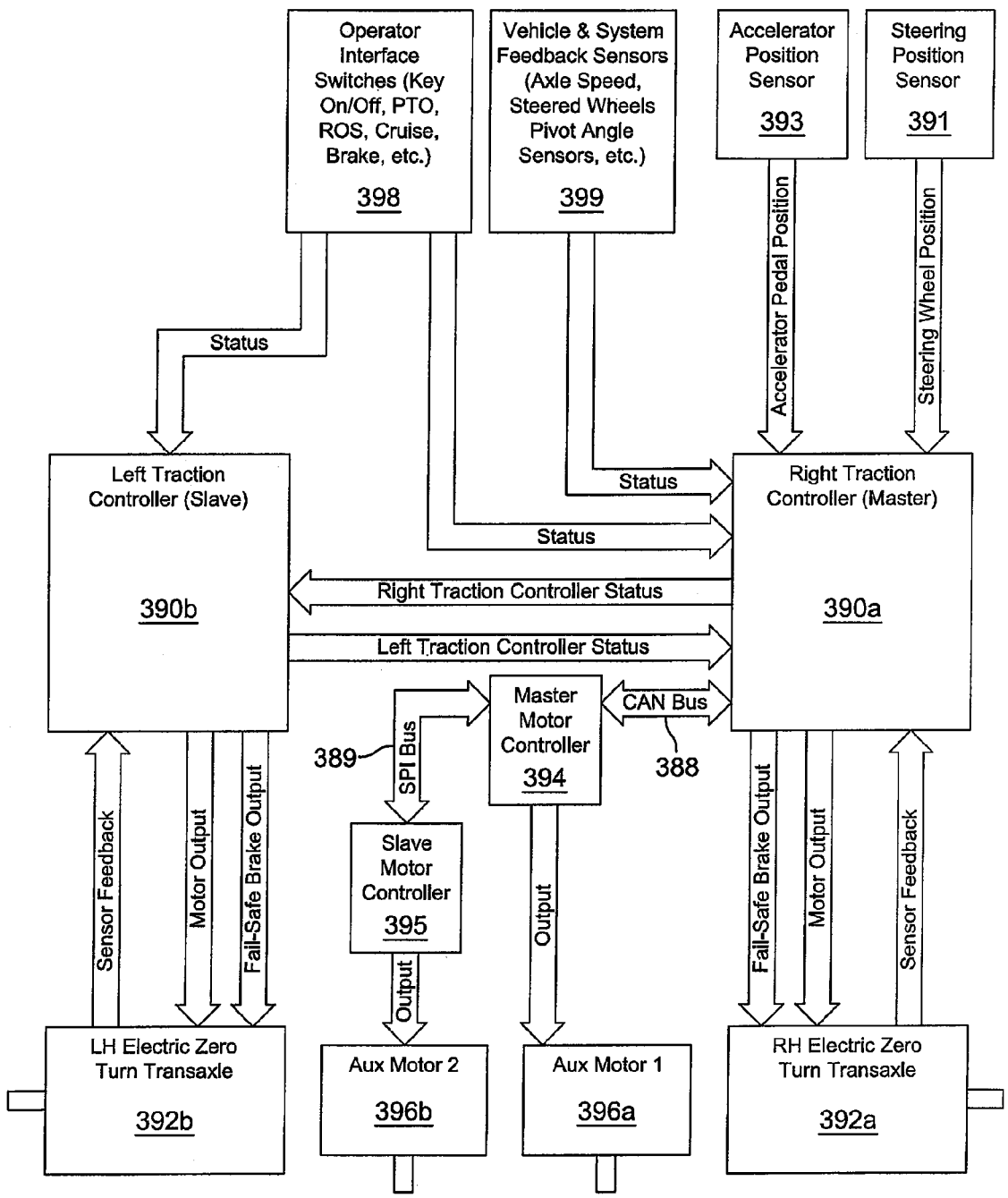
FIG. 9 is a block diagram of an embodiment of a control system applicable to a vehicle similar to the vehicles depicted in FIGS. 5 and 6 and incorporating a steering wheel rather than steering/drive levers.

FIG. 9 illustrates another embodiment of the functional relationship and communication between various components of a control system in accordance with one or more principles of the present invention, which is also adaptable to vehicles 200 and 300. In this particular embodiment, a steering wheel is utilized to effectuate steering for a zero turn vehicle arrangement via master and slave traction controllers, and a master motor controller and a slave motor controller are configured to control a pair of auxiliary motors in the form of deck motors, which drive mower blades. As illustrated in FIG. 9, a master traction controller 390a and a slave traction controller 390b communicate with each other in a manner similar to controllers 290a and 290b of FIG. 7. Master traction controller 390a also communicates directly with transaxle 392a and slave traction controller 390b communicates directly with transaxle 392b. Master traction controller 390a also communicates with a master motor controller 394, preferably via a CAN bus 388 (or other bus type or communication standard). The master motor controller 394 communicates with auxiliary motor 396a and slave motor controller 395 via SPI bus 389. Slave motor controller 395 communicates with auxiliary motor 396b. Operator interfaces 398, such as, for example, key on/off, PTO, ROS, cruise, and brake, are in communication with traction controllers 390a and 390b. Master traction controller 390a also receives input from steering position sensor 391, accelerator position sensor 393, and may additionally receive input from vehicle and system feedback sensors 399 to improve control of the vehicle.

With respect to all of the embodiments disclosed herein, the control system preferably controls three general categories of vehicle functionality: (1) diagnostics and start-up associated with the traction controller to enable the control system, (2) operational parameters or constraints for the traction controller during operation, and (3) operational parameters or constraints for other features of the traction controller and the deck controller and related systems. Each of these general categories and embodiments of functionality is discussed below.

There are several control aspects related to starting and running the vehicle. Because the vehicle is accelerated electrically, a diagnostics routine is performed on the electronics prior to permitting the vehicle to be operated. Referring to FIGS. 4 and 8, when key switch 58 is rotated to an "on" position, traction controller(s) 80, 220 performs an array of diagnostics. Once the diagnostics have successfully been completed, a relay permits actuation of power contactor 152, 252. As will be noted in more detail later, traction controller (s) 80, 220 monitors a variety of conditions and has the ability to shut down the system by way of disengaging power contactor 152, 252. Once power contactor 152, 252 is engaged, functionality of the fail-safe, normally-closed brake(s) 160, 260 is checked. Part of this check involves verifying the brake holding capacity at start-up to ensure serviceability. During this test, traction controller(s) 80, 220 drives the electric motor(s) 41, 241 to the required holding torque specification while the brake is engaged and monitors whether the drive wheels 36 move under application of the torque. If the check fails, the controller can be programmed to allow operation in a reduced power mode or disable the electric drive system. The controller can also be programmed to bypass the fail-safe holding torque check.

As the system continues diagnostics that will enable traction controller(s) 80, 220 and mower deck controller 82, 230, seat switch 162 is checked to verify operator presence. Functionality of traction controller(s) 80, 220 is checked, the neutral state of the vehicle is verified, and the drive state is enabled. The inactive state of PTO switch 60 and cruise switch 62 is also verified. The position of ROS switch 64 is checked against the drive state of the vehicle. After the diagnostic program passes checks, LED indicator lamp 56 indicates a "No Error" state, and power contactor 152, 252 is switched on to enable the vehicle to be driven.

Referring again to FIGS. 4 and 8, when power contactor 152, 252 is switched on, traction controller(s) 80, 220 is enabled. Traction controller(s) 80, 220 receives signals from various inputs and sources of the vehicle that relate to motive operation. Initially, a check for inputs from accelerator pedal 52 or drive levers 236 is performed. If accelerator pedal 52 or drive levers 236 have been moved out of the neutral position, brake(s) 160, 260 is disengaged to allow the vehicle to travel the respective speed and direction indicated. Acceleration and deceleration characteristics can be programmed via software in connection with traction controller(s) 80, 220, which allows selection of acceleration or deceleration curves with different characteristics for greater operator satisfaction and control based on operator inputs or vehicle conditions. For example, deceleration curves may be programmed for a coast-to-stop function or for a panic-stop function when encountering a sudden hazard. A panic-stop may be initiated by operator input or by object detection sensor (not shown) input to traction controller(s) 80, 220. Other sensors or system diagnostics may also be used to initiate a system-controlled vehicle stop. The acceleration or deceleration curves can be predetermined and stored in a memory associated with the controller, or optionally can be customizable and programmed by a manufacturer (including original equipment manufacturers and authorized service technicians) given certain safety constraints.

Once traction controller(s) 80, 220 is enabled, and when programmed safe operating conditions are met, PTO switch 60 can be activated to run auxiliary or deck motors 145, 234 associated with mower deck 34, 235 (or other optional attachment or implement). The current draw by drive motor(s) 41, 241 can be regulated for control. For example, the current draw can be regulated manually with the addition of an operator-manipulated potentiometer (e.g., knob or slide control—not shown). Optionally, the current draw can be automatically regulated via traction controller(s) 80, 220 to slow the vehicle if induced loads become high, such as when mowing thick or tall grass or when traveling up a steep grade. This can be accomplished by enabling communication between traction controller 80, 220a and deck controller 82, 230, such as via CAN bus or other control unit connection standard. Such regulation lowers power consumption, extends battery life between charges and optimizes operation levels to extend service life. Other signals may be desirable to enable the control system to provide safer and more effective operation of the vehicle. Traction controller(s) 80, 220 may provide an indication of the operating condition of the traction or deck drive systems by way of an indicator such as LED or indicator lamp 22 or by way of other operator interfaces which may be visual, audible, or a combination of visual and audible.

The remaining control aspects of traction controller(s) 80, 220 relate to operation of deck motors 145, 234 associated with mower deck 34, 235. Once traction controller(s) 80, 220 is enabled, the operator has the ability to activate deck controller 82, 230. Deck controller 82, 230 drives mower deck motors 145, 234 which, in the embodiment shown, are controlled independently by two separate circuit boards (one for each motor) housed within deck controller 82, 230. Operator actuation of PTO switch 60, when programmed safe operating conditions are met, will cause deck controller 82, 230 to power deck motors 145, 234 which drive the cutting blades of mower deck 34, 235. In a particular embodiment, deck motors 145, 234 are brushless DC (BLDC) motors, which each include Hall Effect sensors that provide feedback information to deck controller 82, 230. Optionally, sensorless PMSMs (permanent magnet synchronous motors) may be employed utilizing other feedback arrangements known in the art, such as motor position and timing estimates based on software algorithms. A temperature sensor (not shown) is also included in each deck motor to provide feedback to deck controller 82, 230 to prevent overheating of deck motors 145, 234. Additionally, over-current and over-voltage sensors (not shown) are included in deck controller 82, 230 to prevent damage to deck motors 145, 234. Again, optionally, other feedback arrangements can be utilized, such as motor position and timing estimates, voltage and current estimates, etc., based on software algorithms. In an alternate embodiment (not shown), feedback from sensors in deck motors 145, 234 and deck controller 82, 230 can be integrated with feedback from sensors providing information to traction controller(s) 80, 220 and used to regulate the speed of the vehicle. This integration can be used to limit power consumption and proportionately adjust for the load each drive encounters with respect to available power. As noted above, this can be accomplished by utilizing a CAN-bus. Additionally, axle shafts 43, 213 may have speed sensors (not shown) associated with them. Speed sensors may be used for several purposes, such as, for example, determining the neutral position or neutral state of transmission 42, 214, which allows the controller to presume transmission 42, 214 is in the neutral position when the neutral position or state is sensed. Speed sensors associated with axle shafts 43, 213 would, among other things, enhance the ability to establish the non-rotating condition of axle shafts 43, 213, thereby further defining the neutral position. The controller system could automatically initiate a vehicle speed reduction in the mowing state and make further adjustments under increasing loads. This can be triggered alternatively by current draw or temperature constraints.

According to another aspect, deck controller 82, 230 allows for a programmable timeout if the vehicle is stopped for a set period of time. Other power conservation and safety features can be readily programmed, such as a multi-stage shutdown sequence to protect and manage power supply 32, 238 when the charge has deteriorated to specified levels. In a particular embodiment, the first time the specified minimum voltage level is reached and sensed for a predetermined period (5 seconds, for example), the deck motors 145, 234 associated with deck 34, 235 are disabled and a reduced vehicle speed is implemented to reduce the load on power supply 32, 238. If the voltage then draws down to the minimum voltage level and is sensed for more than a predetermined period a second time, the traction drive speed is reduced again (to 20% of maximum, for example). If the minimum charge level is reached and sensed for a predetermined period a third time, the traction drive may be disabled, stopping the vehicle.

Optionally, the vehicle may enter a hibernation state wherein travel modes are disabled, but minimal power is still available to energize, for example, a visual display, emergency lights, or an emergency signal transmitter while key switch 58 remains in the ON position.

An alarm to remind the operator to recharge power supply 32, 238 can be employed at vehicle shutdown to help prevent deep battery discharge and prepare the vehicle for next use. A plug-in "smart" charger may be used to charge power supply 32, 238. This "smart" charger may be on-board the vehicle or external to the vehicle. Another optional feature is employment of regenerative braking of the electric motor(s) to charge the system power supply during braking or when the vehicle is coasting.

When attempting to move in reverse with a mower deck engaged, a reverse operating system typically stops the blades of the mower deck by removing power from an electric clutch-brake or by killing the prime mover to stop the vehicle. In the embodiment shown, closing ROS switch 64 allows the operator to bypass this function to permit operation of deck motors 145, 234 and associated mower blades when accelerator pedal 52 or drive levers 236 are moved to a position indicating reverse travel of the vehicle. This ROS function is facilitated by the interaction between traction controller(s) 80, 220 and deck controller 82, 230. The ROS function allows uninterrupted mowing in reverse without worry of a time-out condition. Only when the vehicle is shifted out of reverse will the ROS function be deactivated. Once shifted out of reverse, this mode can only be reinitiated by activating ROS switch 64 before shifting the vehicle back into reverse. The vehicle must be in either neutral or forward to activate the ROS switch 64. A 2-position ROS switch 64 is indicated in FIGS. 4 and 8, but a momentary switch or other switch forms could be substituted. Alternatively, an ROS position can be added to key switch 58, thereby eliminating the need for separate ROS switch 64. Additionally, traction controller(s) 80, 220 can be programmed to automatically slow the vehicle when moving in reverse and/or when mowing in reverse. Audible and/or visual alarms (which may include error codes), object detection systems, etc., may also be activated when moving and/or mowing in reverse.

Software switches can be used to slow the vehicle, stop the vehicle or blades automatically, or enable auxiliary functions when certain operating, alarm, or emergency conditions are met or encountered while operating the vehicle. As an additional safety feature, brake(s) 160, 260 may be configured to engage the traction drive motor(s) when the vehicle is stopped or stalled. A manual release cable (or other linkage) may be used with brake(s) 160, 260 to allow the operator to disengage the brake(s) in order to move the vehicle. The manual release cable may be combined with an integrated switch in communication with traction controller(s) 80, 220 to ensure that the vehicle is disabled when moving the vehicle. Functionally, this gives the operator a bypass option to push or tow the vehicle.

The flexible programming capability of mower deck controller 82, 230 driving the blades in mower deck 34, 235 allows inclusion of a slight delay and/or ramping up to optimal cutting speed for both safety and energy conservation. Another feature that can be implemented is a blade stop function that performs a controlled stop of mower blades when either PTO switch 60 is deactivated or when key switch 58 is deactivated. For example, a capacitor in deck controller 82, 230 can latch power so that when PTO switch 60 is deactivated, or if key switch 58 is switched off before PTO switch 60 is deactivated, mower deck controller 82, 230 can back-drive deck motors 145, 234 to stop mower blades within a programmed interval instead of allowing them to coast to a stop. For example, this programmed interval may be specified as 5 seconds or some other specification corresponding to an industry standard such as ANSI (American National Standards Institute) or an OEM (original equipment manufacturer) specification. Controlled braking of mower blades can also be accomplished by utilizing regenerative braking or mechanical braking.

Additionally, deck controller 82, 230 may receive a signal from traction controller 80, 220a to stop deck motors 145, 234 when the vehicle has not moved for a programmed time interval, or if the vehicle exceeds a programmed maximum travel speed (axle speed sensors, for example, can enable both of these functions), or if other vehicle operational parameters are exceeded.

Figure 10:
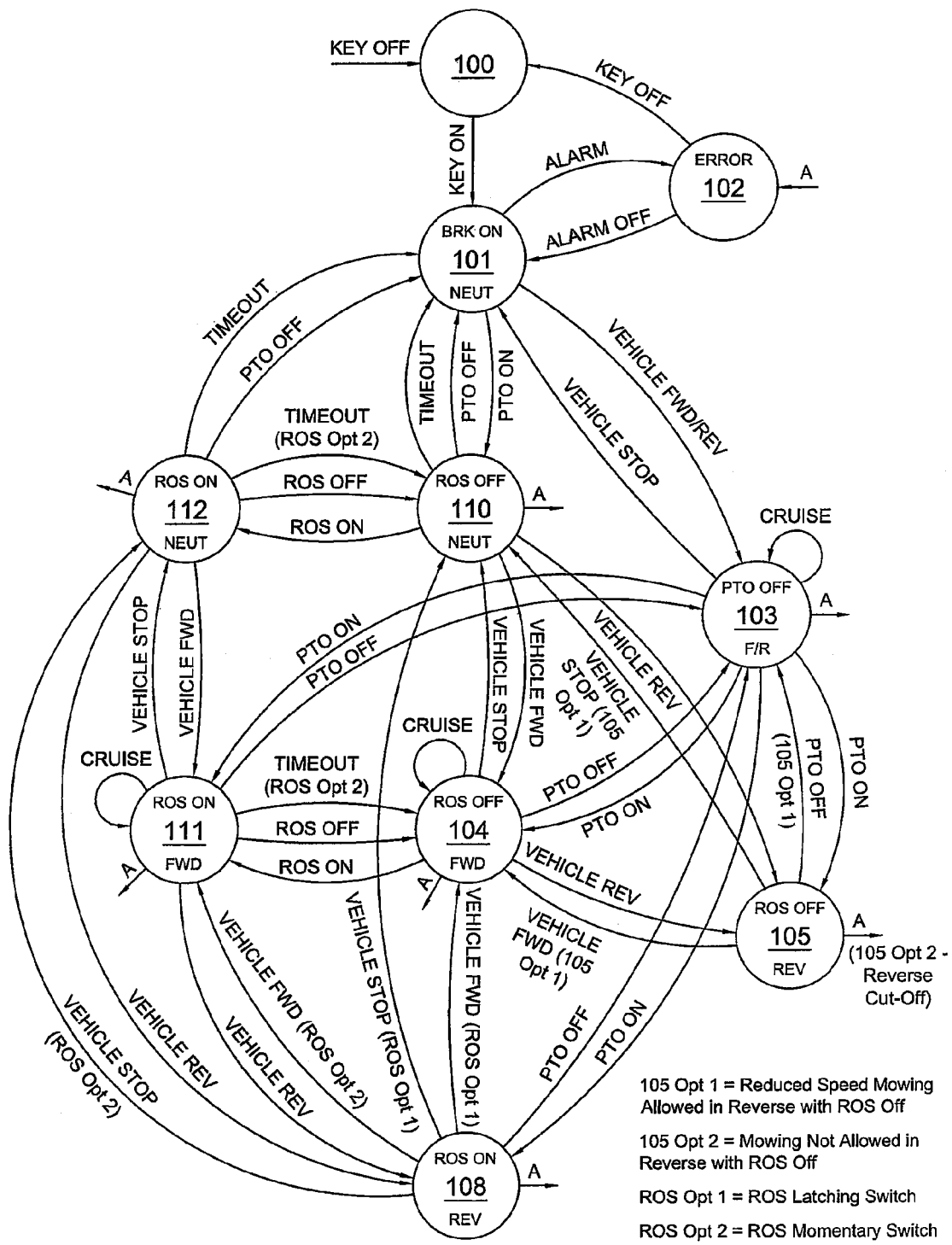
FIG. 10 is a bubble state map representing an embodiment of control logic that can be applied to one or more of the control systems of the present invention.

Turning now to FIG. 10 (the traction controller state map), various combinations of actuator and switch positions define various states for traction, PTO, ROS, cruise, key switch, sensors and errors while utilizing operating control system functions as illustrated. Illustrated are 10 different preferred states of operation for the traction controller, and interrelationships of these states.

It should be noted that, while a steering wheel/accelerator controlled electric vehicle requires differences in the control system and control algorithms when compared to a drive lever controlled electric vehicle, the operational states shown and described herein are applicable to both electric vehicle types.

In reference to the cruise modes allowed in several of the vehicle states shown on FIG. 10, it should also be noted that a cruise function requires more complex programming for a drive lever steered vehicle with independently driven output or axle shafts than is required for a vehicle such as, for example, a steering wheel/accelerator controlled vehicle with a single transaxle. For a zero-turn vehicle with independently driven axle shafts, processor recognition, implementation and control of travel modes (vehicle speed and direction combinations) can be enabled with closed-loop control, utilizing sensors to monitor the speeds of the axle shafts. Based on operator inputs and feedback from axle speed sensors, processor(s) can recognize and control travel modes such as, for example, a slow forward zero-turn, a fast forward non-zero turn, a slow reverse turn, mowing in reverse at a reduced speed, etc. Processing of operator inputs in a drive lever controlled vehicle includes consideration of the combined position signals associated with the drive levers to determine forward or reverse travel mode. Closed-loop control may be particularly useful in the control of a cruise function on a zero-turn vehicle, whereon it may be necessary or desirable to adjust power to electric traction motors to balance axle speeds to maintain straight tracking or limit vehicle turning speeds. It is also possible to allow initiation of the cruise function only when drive levers are within a certain programmed positional tolerance (such as, for example, plus or minus 2 degrees of rotation), relative to one another, thereby requiring the operator to travel forward in an approximately straight line while initiating cruise mode. Then, after the cruise function is initiated, the processor may allow vehicle turning only within certain parameters, based on absolute axle speed and axle speed differential. If, for instance, axle speed parameters are exceeded, such as in a fast, tight turn, the processor can cancel the cruise function and/or slow the vehicle travel speed.

The first state 100 is the vehicle OFF state in which the vehicle is powered down and controllers are disabled with key switch 58 in the OFF position.

State 101 is a diagnostic and preparation to operate state, which includes a ready or standing state, if diagnostics pass. If diagnostics fail, state 101 passes to error state 102 and an alarm is actuated. Any of the following states described herein can pass to error state 102 if they fail any of the conditions outlined for operation within a particular state. State 101 consists of key switch 58 on, internal diagnostics pass, PTO switch 60 off, ROS switch 64 off, cruise switch 62 off, operator in seat (actuating seat switch 162), accelerator pedal 52 or drive levers 236 in neutral, and manual brake switch 66 off. Also, electric brake(s) 160, 260 coil resistance is measured to determine presence of the coil. Optionally, the brake holding capacity check, as previously described, may be employed as well. If all of these conditions are met, power contactor 152 (or 252) is closed. If the operator then actuates PTO switch 60, control passes to state 110 and the PTO timeout timer is set. Alternatively, if the operator first actuates the accelerator pedal 52 or drive levers 236, a test of brake(s) 160, 260 is performed. If the brake test is passed, the controller(s) 80, 220 passes control to state 103.

State 102 is an error state in which errors can be categorized as recoverable or non-recoverable. For non-recoverable errors, control remains in state 102 until key switch 58 is turned off. Recoverable errors can be resolved without cycling key switch 58 and, when resolved, the alarm is deactivated. Non-recoverable errors occur when the controller shuts off the PTO, shuts down the vehicle for not meeting a specified minimum voltage requirement, a hardware failure is detected, a diagnostic failure occurs, seat switch 162 is detected open in a state other than state 101 (recoverable error in state 101), or a test of brake(s) 160, 260 fails. Recoverable errors may be defined to include, for example, a condition when the operator is not in the seat, an accelerator pedal or drive lever is not in neutral, a manual brake release switch is in an ON position, etc. Any alarm or emergency condition (for both recoverable and non-recoverable errors) encountered by traction controller(s) 80, 220 or deck controller 82, 230 will result in passing control to state 102 and stopping of both the vehicle and the deck blades. If PTO switch 60 was on before entering error state 102, it will be necessary to cycle PTO switch 60 after recovery from the error in order to resume operation of mower deck motors 145, 234.

State 103 is a transport state where the vehicle is in a travel-only mode. State 103 consists of key switch 58 on, internal diagnostics pass, PTO switch 60 off, ROS switch 64 on or off, cruise switch 62 on or off, operator in seat (actuating seat switch 162), accelerator pedal 52 in either forward or reverse position (or drive levers 236 in either forward or reverse mode) and maximum speed enabled. As mentioned previously, it is the combined position signals of drive levers 236 which are processed to determine a forward or reverse travel mode (since one lever may be forward of a neutral position while the other is rearward of a neutral position during either a forward or reverse turn. The sequence starts with the operator closing seat switch 162 and then actuating accelerator pedal 52 or drive levers 236. A test of brake(s) 160, 260 is performed by traction controller(s) 80, 220 and, if passed, brake(s) 160, 260 is released and electric motor(s) 41, 241 is started in the direction signaled by the operator's input. If the PTO is activated while in state 103, controller(s) 80, 220 passes control to state 104, 105, 108, or 111, depending on a combination of accelerator pedal 52 or drive levers 236 position(s) in forward or reverse (position or mode) and ROS switch 64 position (on or off). If traction controller(s) 80, 220 determines it should pass control to state 105 (attempted reverse mowing with ROS off), then either the vehicle speed is greatly reduced and mowing is allowed ("105 Opt 1" in FIG. 10) or, if a reverse cut-off function is selected in the software, then mowing is not allowed ("105 Opt 2" in FIG. 10) and a non-recoverable error is generated and control passes to state 102. If control passes to state 104, 108, or 111, the vehicle speed is limited to a programmed forward mowing speed. Cruise switch 62 will only function if traveling forward and then the speed is maintained while traveling forward. Activating cruise switch 62 while traveling forward "freezes" the actual current vehicle speed. The cruise condition is terminated if brake pedal 54 is depressed, or accelerator pedal 52 or drive levers 236 are moved into reverse position (or reverse mode), or accelerator pedal 52 or driver levers 236 are pressed forward further than the "frozen" position, or cruise switch 62 is actuated while the accelerator pedal or drive levers are in the neutral position(s). While in cruise mode, if accelerator pedal 52 or drive levers 236 are pressed forward and cruise switch 62 is actuated again, the "frozen" cruise value will be updated, reflecting the new accelerator position. When accelerator pedal 52 or drive levers 236 are moved into the neutral position(s), the vehicle stops, and when accelerator pedal 52 or drive levers 236 remain in the neutral position(s) for a specified, programmed time interval (such as, for example, 0.4 seconds), traction controller(s) 80, 220 will return to state 101 and engage brake(s) 160, 260. If manual brake switch 66 is activated, controller(s) 80, 220 overrides accelerator pedal 52 or drive levers 236, forces electric motor(s) 41, 241 to zero rpm, stops the vehicle and engages brake(s) 160, 260. When operating in state 103, if ROS switch 64 is in the ON position and PTO switch 60 is then switched to the ON position, traction controller(s) 80, 220 will jump to state 111 if moving forward and state 108 if moving in reverse. Conversely, if ROS switch 64 is in the OFF position and PTO switch 60 is then switched to the ON position, traction controller(s) 80, 220 will jump to state 104 if moving forward and state 105 if moving in reverse.

State 104 is the forward mowing state with ROS off, traveling at a reduced working speed. State 104 consists of key switch 58 on, internal diagnostics pass, PTO switch 60 on, ROS switch 64 off, cruise switch 62 on or off, operator in seat (actuating seat switch 162), accelerator pedal 52 or drive levers 236 in forward (or forward mode) and working speed reduction enabled. When accelerator pedal 52 or drive levers 236 are moved into the neutral position(s), the vehicle stops, and when accelerator pedal 52 or drive levers 236 remain in the neutral position(s) for a specified, programmed time interval, traction controller(s) 80, 220 jumps to state 110 and engages brake(s) 160, 260. When PTO switch 60 is switched off, traction controller 80, 220*a* jumps to state 103 and sends a signal to the deck controller 82, 230 to stop deck motors 145, 234. When accelerator pedal 52 or drive levers 236 are moved into reverse position (or reverse mode), control jumps to state 105 and the vehicle transitions from forward travel to reverse travel, if allowed by software settings. Alternatively, when accelerator pedal 52 or drive levers 236 are moved into reverse position (or reverse mode), control jumps to state 105 and then to error state 102, if not allowed by software settings. If ROS switch 64 is switched on, traction controller(s) 80, 220 jumps to state 111. If a momentary ROS switch 64 is used (referenced in FIG. 10 as "ROS Opt 2"), the timeout feature is set before transferring to state 111.

State 105 is the attempted reverse mowing with ROS off state. State 105 consists of key switch 58 on, internal diagnostics pass, PTO switch 60 on, ROS switch 64 off, cruise switch 62 off, operator in seat (actuating seat switch 162), accelerator pedal 52 or drive levers 236 in reverse (or reverse mode) and either a speed reduction function or a cut-off function enabled. Depending on software settings, state 105 either allows mowing in reverse at reduced speed when accelerator pedal 52 or drive levers 236 are in the reverse position or reverse mode (referenced in FIG. 10 as "105 Opt 1"), or it does not allow any mowing (referenced in FIG. 10 as "105 Opt 2—Reverse Cut-Off") and control is passed to state 102 and an alarm is generated. If reduced speed mowing is allowed in state 105, the reduced speed may be programmed at, for example, approximately one foot per second maximum for safety, or other specification corresponding to an industry standard such as ANSI or an OEM specification. If not allowed, and control is passed to state 102 as mentioned above, this is a non-recoverable error, so key switch 58 must be turned off and back on to proceed. ROS switch 64 is disabled while in state 105, so it will not function if switched on while in state 105. Under "105 Opt 1", when accelerator pedal 52 or drive levers 236 are moved into the neutral position(s), the vehicle stops, and when accelerator pedal 52 or drive levers 236 remain in the neutral position(s) for a specified, programmed time interval, traction controller(s) 80, 220 jumps to state 110 and brake(s) 160, 260 is applied. If PTO switch 60 is switched off, control jumps to state 103 and deck motors 145, 234 are stopped. If accelerator pedal 52 or drive levers 236 are moved into forward position (or forward mode), traction controller(s) 80, 220 jumps to state 104 and the vehicle transitions from reverse travel to forward travel.

State 108 is the reverse mowing state with ROS on, operating at a reduced working speed. State 108 consists of key switch 58 on, internal diagnostics pass, PTO switch 60 on, ROS switch 64 on, cruise switch 62 off, operator in seat (actuating seat switch 162), accelerator pedal 52 or drive levers 236 in reverse (or reverse mode) and working speed reduction enabled. When PTO switch 60 is switched off, traction controller(s) 80, 220 jumps to state 103 and deck motors 145, 234 are stopped. If a latching ROS switch 64 is used (under "ROS Opt 1"), when accelerator pedal 52 or drive levers 236 are moved into the neutral position(s), the vehicle stops, and when accelerator pedal 52 or drive levers 236 remain in the neutral position(s) for a specified, programmed time interval, traction controller(s) 80, 220 jumps to state 110 and brake(s) 160, 260 is applied. If accelerator pedal 52 or drive levers 236 are moved into forward position (or forward mode), traction controller(s) 80, 220 jumps to state 104 (under "ROS Opt 1") and the vehicle transitions from reverse travel to forward travel. If a momentary ROS switch is used (under "ROS Opt 2"), when accelerator pedal 52 or drive levers 236 are moved into the neutral position(s), the vehicle stops, and when accelerator pedal 52 or drive levers 236 remain in the neutral position(s) for a specified, programmed time interval, traction controller(s) 80, 220 jumps to state 112 and brake(s) 160, 260 is applied. If accelerator pedal 52 or drive levers 236 are moved into forward position (or forward mode), traction controller(s) 80, 220 jumps to state 111 (under "ROS Opt 2") and the vehicle transitions from reverse travel to forward travel.

State 110 is a temporary, stationary vehicle state with PTO switch 60 on and ROS switch 64 off. State 110 consists of key switch 58 on, internal diagnostics pass, PTO switch 60 on, ROS switch 64 off, cruise switch 62 off, operator in seat (actuating seat switch 162), accelerator pedal 52 or drive levers 236 in neutral, working speed reduction enabled and electric brake(s) 160, 260 applied. When the PTO timeout has elapsed, PTO switch 60 is switched off by the software and traction controller(s) 80, 220 jumps to state 101. If accelerator pedal 52 or drive levers 236 are moved into the forward position (or forward mode), traction controller(s) 80, 220 will jump to state 104 or, if moved into the reverse position (or reverse mode), to state 105. If ROS switch 64 is switched on, traction controller(s) 80, 220 will jump to state 112. If a momentary ROS switch 64 is used ("ROS Opt 2"), traction controller(s) 80, 220 sets the ROS timeout timer before transfer to state 112.

State 111 is the forward mowing state with ROS on (and which enables a timeout function for the ROS under "ROS Opt 2"). State 111 consists of key switch 58 on, internal diagnostics pass, PTO switch 60 on, ROS switch 64 on, cruise switch 62 on or off, operator in seat (actuating seat switch 162), accelerator pedal 52 or drive levers 236 in forward (or forward mode) and working speed reduction enabled. If accelerator pedal 52 or drive levers 236 are moved into reverse position (or reverse mode), traction controller(s) 80, 220 jumps to state 108 and the vehicle transitions from forward travel to reverse travel. When PTO switch 60 is switched off, traction controller(s) 80, 220 jumps to state 103 and deck motors 145, 234 are stopped. When accelerator pedal 52 or drive levers 236 are moved into the neutral position(s), the vehicle stops, and when accelerator pedal 52 or drive levers 236 remain in the neutral position(s) for a specified, programmed time interval, traction controller(s) 80, 220 jumps to state 112 and brake(s) 160, 260 is applied. If ROS switch 64 is switched off, traction controller(s) 80, 220 jumps to state 104. If a momentary ROS switch 64 is used ("ROS Opt 2"), and if the ROS timeout elapses, traction controller(s) 80, 220 jumps to state 104.

State 112 is a temporary, stationary vehicle state with ROS switch 64 and PTO switch 60 both on (and which enables a timeout function for the ROS under "ROS Opt 2"). State 112 consists of key switch 58 on, internal diagnostics pass, PTO switch 60 on, ROS switch 64 on, cruise switch 62 off, operator in seat (actuating seat switch 162), accelerator pedal 52 or drive levers 236 in neutral and working speed reduction enabled. When the PTO timeout elapses, traction controller(s) 80, 220 jumps to state 101 and deck motors 145, 234 are stopped. If accelerator pedal 52 or drive levers 236 are moved into the forward position (or forward mode), traction controller(s) 80, 220 will jump to state 111 or, if moved into the reverse position (or reverse mode), to state 108. If ROS switch 64 is switched off, traction controller(s) 80, 220 jumps to state 110. If a momentary ROS switch 64 is used ("ROS Opt 2"), and if the ROS timeout elapses, controller(s) 80, 220 jumps to state 110.

Figure 11:
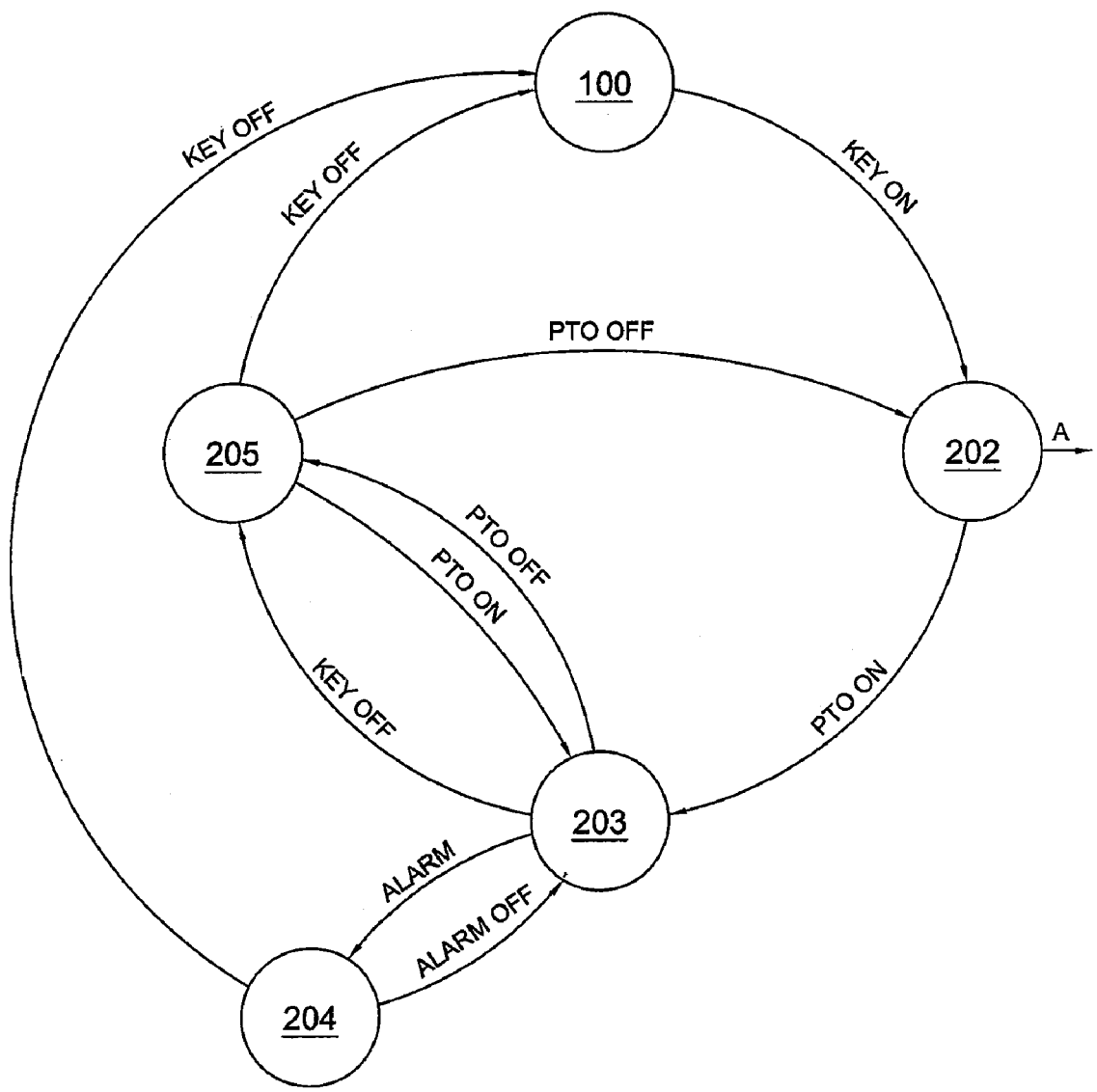
FIG. 11 is a bubble state map representing an embodiment of control logic that can be applied to one or more of the control systems of the present invention.

Turning now to FIG. 11 (the deck controller 82, 230 state map), various combinations of actuator and switch positions define various states for the PTO, key switch and errors while utilizing operating controller system functions as illustrated. Illustrated are 5 different states of operation for deck controller 82, 230 and the interrelationships of these states.

State 100, as previously described above, is the vehicle OFF state in which the vehicle is powered down and controllers are disabled with key switch 58 in the OFF position. When key switch 58 is switched on, and after diagnostics have passed, deck controller 82, 230 is enabled by controller 80, 220a and deck control passes to state 202.

In state 202, deck controller 82, 230 is enabled with key switch 58 on and PTO switch 60 off. When PTO switch 60 is switched on, deck controller 82, 230 jumps to state 203.

In state 203, deck controller 82, 230 is enabled with key switch 58 on and PTO switch 60 on to power mower deck motors 145, 234. From state 203, deck controller 82, 230 transfers control to one of two possible states, error state 204 or PTO disabled state 205.

State 204 is the error state which is entered if one or more deck motors 145, 234 are outside the programmed allowable temperature, current, or voltage range. Once the error is removed, operator cycling of PTO switch 60 once (after a programmed delay of approximately 5 to 10 seconds to prevent overheating of MOSFETs or other sensitive electronic components) will return control to state 203 and start deck motors 145, 234 running again. If key switch 58 is placed in the OFF position while in state 204, deck controller 82, 230 will jump to state 100.

In state 205, the PTO is disabled. Mower deck 34, 235 cutting blades are stopped (within a programmable time limit governed by industry standards or OEM specifications for safety) by pulse width modulation (PWM) control of deck motors 145, 234. When PTO switch 60 is switched off (thereby removing the PTO ground), deck controller 82, 230 jumps to state 202 from state 205. If PTO switch 60 is switched back on and the ground signal is reapplied at state 205 before the motor stopping function is completed, deck controller 82, 230 returns to state 203. If the key remains off in state 205, deck controller 82, 230 returns to state 100.

The embodiments described not only provide the framework for implementing the foregoing control aspects, but numerous other control and operational features as well.

A reverse state of the vehicle can be defined several ways, depending on control architecture and vehicle type. In an embodiment employing two traction controllers and two electric transaxles, the reverse mode can be defined as a vehicle travel condition in which either one or both of the electric transaxles are moving in reverse. In another embodiment, the mode of the vehicle may be defined by the direction of the axle, wheel, tire, etc., having the greater velocity.

Based on the various embodiments set forth herein, it may be advantageous from a cost and manufacturing standpoint to provide a dual auxiliary/deck controller that is capable of controlling either a dual motor-blade combination or a single motor-blade combination. In such an embodiment, when a single motor is utilized with the dual deck controller, approximately half of the drive current is provided by each of the controllers. This parallel drive configuration can be used to drive a single, larger motor to cut a swath which may be comparable in width to the dual motor design shown.

Serial programming is enabled with CAN bus communication. A handheld console can be connected to the master controller for the purpose of reprogramming or changing settings in either the master controller or, through CAN bus communication, the subordinate master auxiliary/deck controller.

Figure 12:
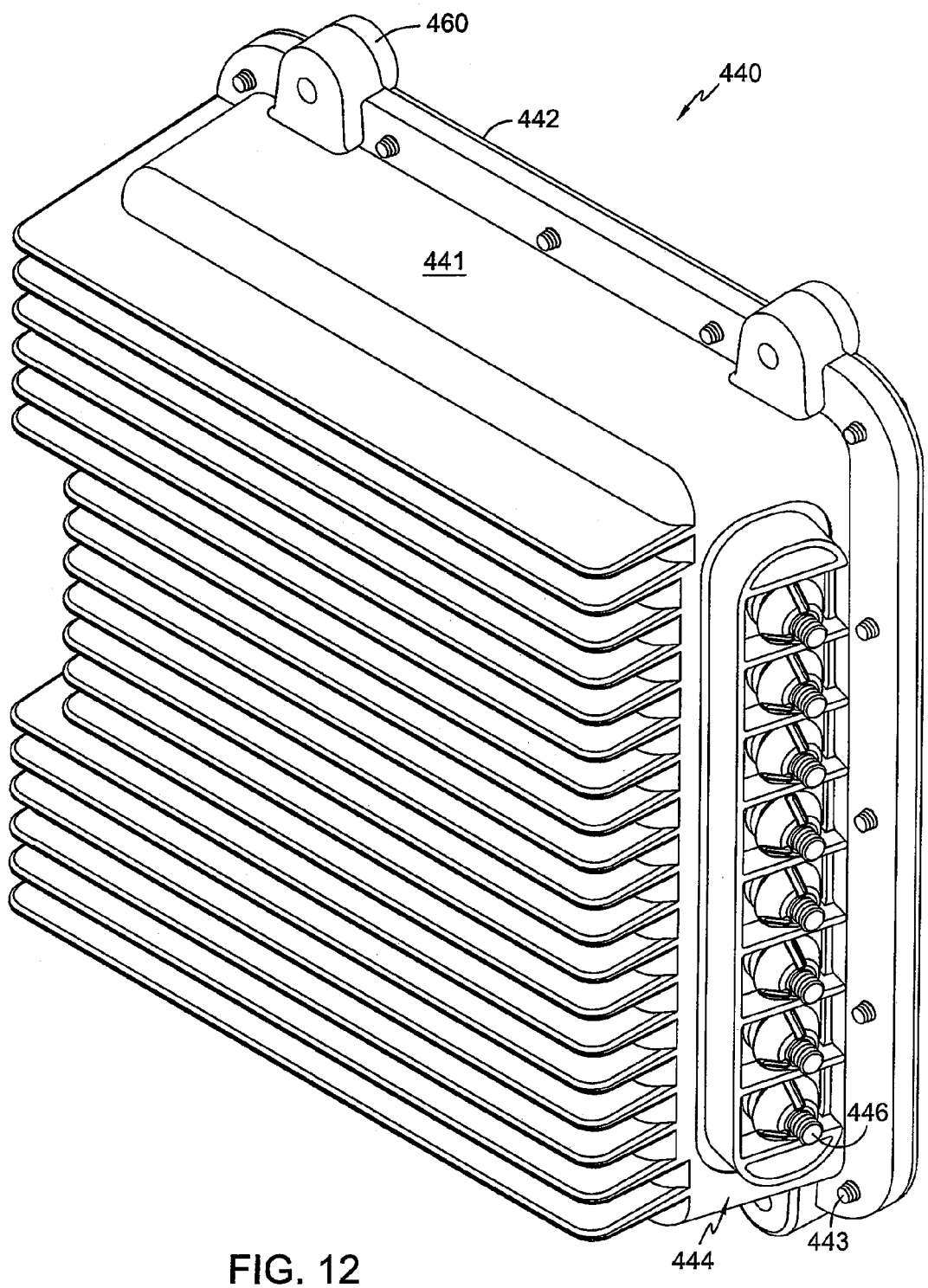
FIG. 12 is a perspective view of a first embodiment of a controller assembly of the present invention.
Figure 13:
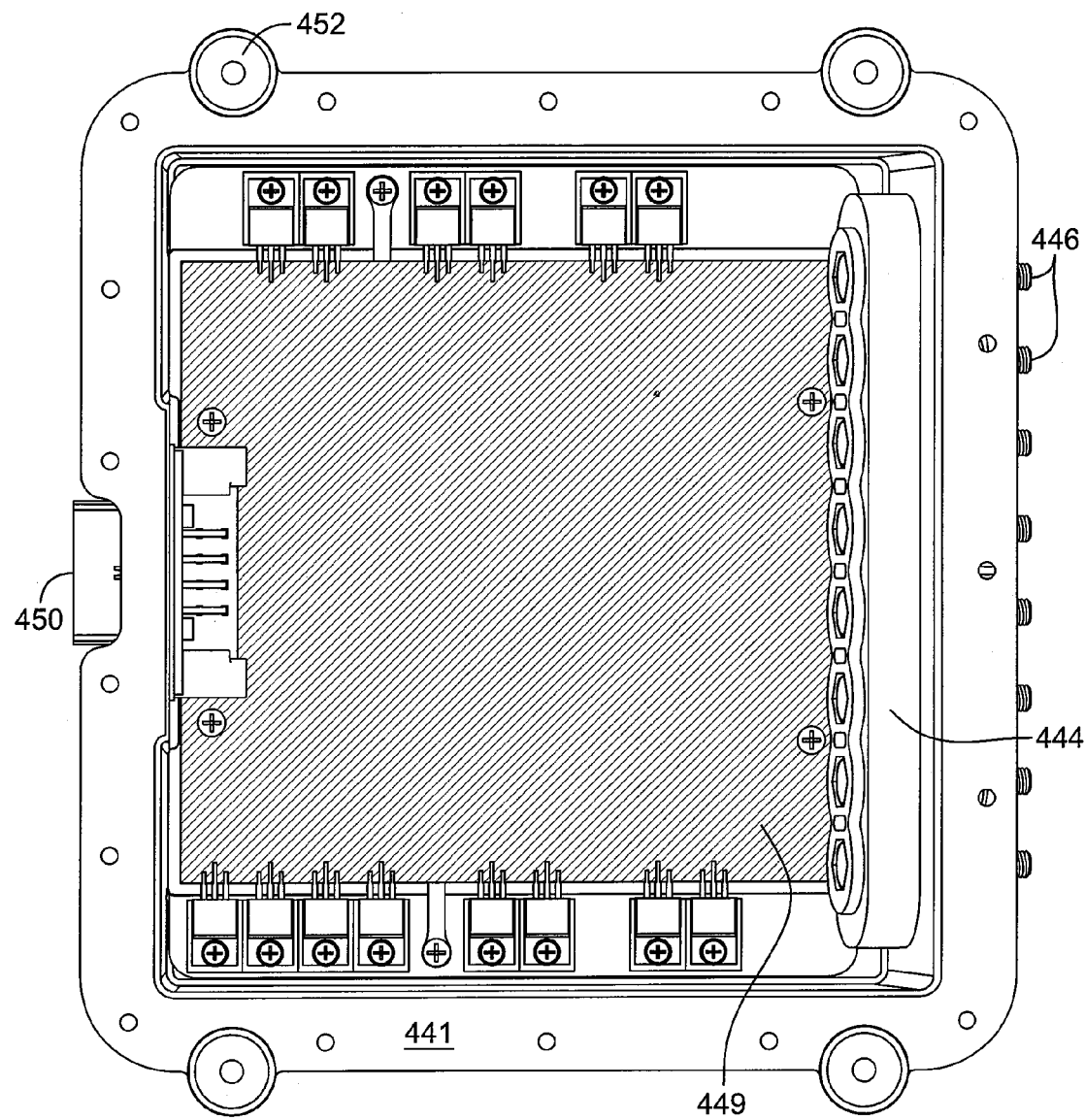
FIG. 13 is a plan view of the controller assembly of FIG. 12 with the base plate removed.
Figure 14:
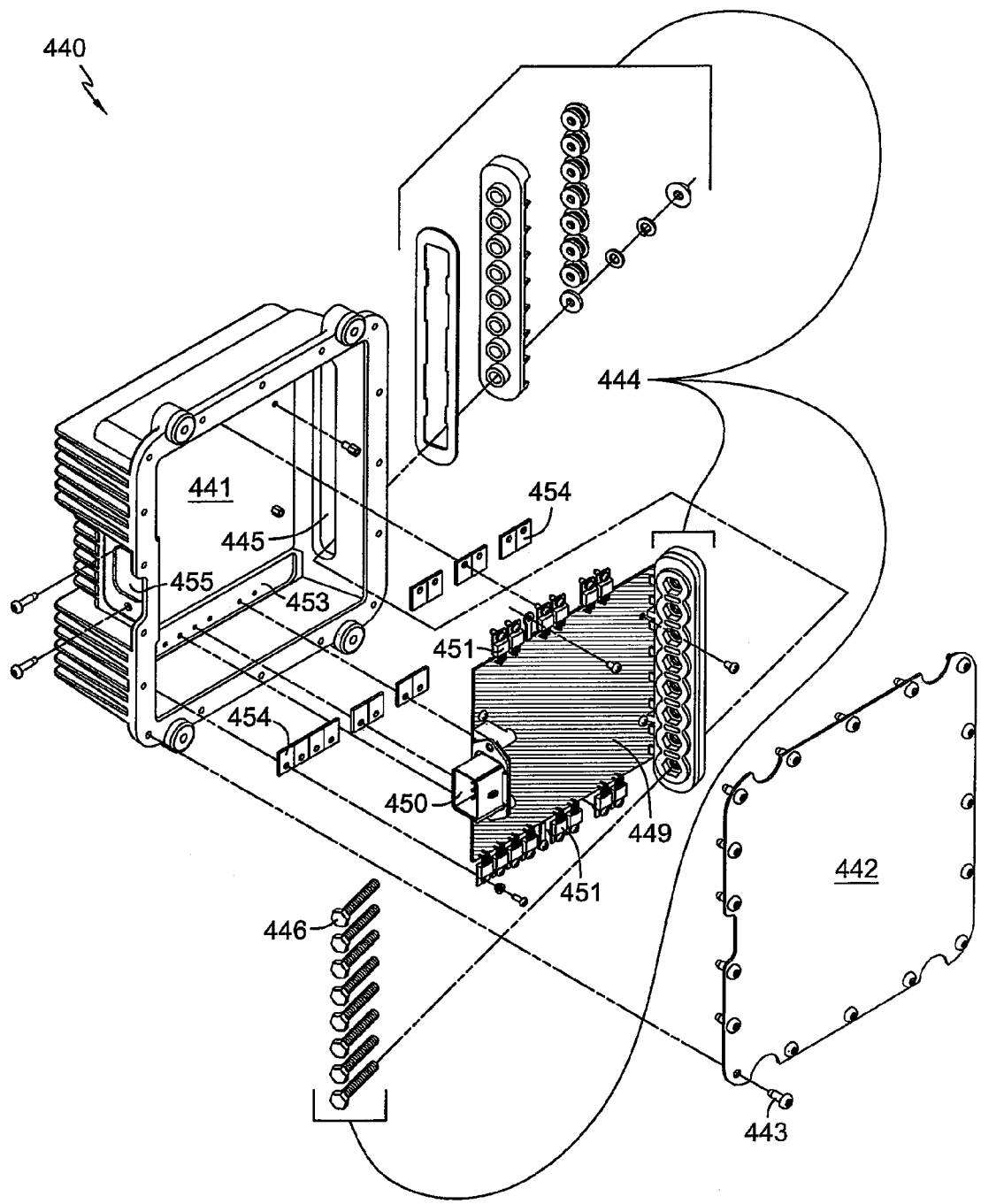
FIG. 14 is an exploded perspective view of the controller assembly of FIG. 12.

Now that the control features of the various traction, deck and auxiliary controllers have been described, attention is directed to the physical positioning of the controllers in an enclosure or assembly mounted on a utility vehicle. FIGS. 12-14 illustrate a controller assembly 440 having a housing 441 and a base plate 442 that combine to form a sealed compartment for accommodating controller board 449, hereinafter referred to as PCB 449. The PCB 449 may comprise one or more of the various traction or motor controllers referred to above, such as, for instance, traction controller 114 shown in FIG. 3. Housing 441 may be formed in a variety of shapes and be of a variety of constructions, however it is depicted in this embodiment as a unitary cover having a plurality of heat-dissipating fins on its top surface to increase surface area exposed to ambient air. The PCB 449 and its components contained within the housing 441 generate significant heat, thus the housing 441 is ideally formed of a material having a high thermal conductivity and specific heat capacity, such as aluminum, zinc-aluminum, ZAMAC (zinc aluminum magnesium and copper), or the like. The housing 441 is preferably an aluminum or aluminum alloy casting. The housing 441 should be of sturdy construction to prevent deformation or damage to the PCB 449 should an object strike the cover. Additionally, controller assembly 440 may be located toward the center of the vehicle in order to provide further protection from incidental contact with objects the vehicle might encounter and in a manner that protects the wiring harnesses connected to controller assembly 440.

As shown in FIG. 14, housing 441 provides a slot 445 along one side and a connector port 455 centered on the other. A terminal block assembly 444 fits within the slot 445 and provides a plurality of terminal posts 446 extending from the controller assembly for connecting to wires (not shown) that communicate with the one or more PCB controlled motors and the power supply. The PCB 449 in FIG. 14 has eight such terminal posts 446, which is sufficient to power two separate 3-phase motors (3 posts for each motor, and 2 posts for the power supply circuit). Thus, this single PCB might comprise both Master Motor Controller 130 and Slave Motor Controller 134 as shown in FIG. 3. An input connector 450 extends through connector port 455 (such as a Molex® brand connector manufactured by Molex Incorporated of Lisle, Ill.) to allow communication between the PCB 449 and the various sensors, switches and other input sources. Two machined lands 453 are disposed inside housing 441 adjacent to opposite edges of the installed PCB 449 for attachment of isolator pads 454, which are used for pad-mounted circuits or components, such as MOSFETs 451. The isolator pads 454 serve to electrically isolate the MOSFETs 451 from contact with the housing 441.

Base plate 442 is a flat plate that is secured to the housing 441 to provide a seal from the outside environment. The base plate 442 and housing 441 may be fastened together using any known means such as bolts, rivets, adhesives, or the like, but uses a plurality of self tapping screws 443 in the illustrated embodiment to provide ease of access to the interior of controller assembly 440 during service.

Housing 441 also provides a plurality of mounting extensions 460 for fastening the controller assembly 440 to the utility vehicle. Each mounting extension 460 includes a mounting foot 452 to provide the base plate 442 with clearance between the housing 441 and the utility vehicle mounting surface. The mounting feet 452 are ideally rubber or a similar dampening material so as to aid in isolating the controller assembly 440 from vibrations transferred through the utility vehicle during operation. In embodiments having multiple controller assemblies 441, the controller assemblies may be mounted to opposite sides of a common mounting surface on the utility vehicle, with a first controller assembly fixed to the top of the mounting surface and a second controller assembly suspended from the opposite side of that same surface, so as to compactly stack controller assemblies in a central location.

A single PCB 449 may include multiple controllers as described in association with FIGS. 3, 7 and 9 above. For instance, deck controller 82 as shown in FIG. 2 may house a single PCB 449 that comprises multiple controllers, such as master motor controller 130 and slave motor controllers 134 shown in FIG. 3. Similarly, in embodiments having separate right and left traction control, a single controller assembly 440 might contain a single PCB 449 that comprises both traction controllers, such as Left Traction Controller 290b and Right Traction Controller 290a as shown in FIG. 7. However, in other embodiments, a single controller assembly may contain multiple PCBs 449 such that both traction and deck (and/or other auxiliary) motors are controlled from a single sealed enclosure. Such embodiments allow for, among other things, improvements and optimization of manufacturability, serviceability, overall vehicle layout, controller durability, cost, control function scalability, and heat dissipation.

Figure 15:
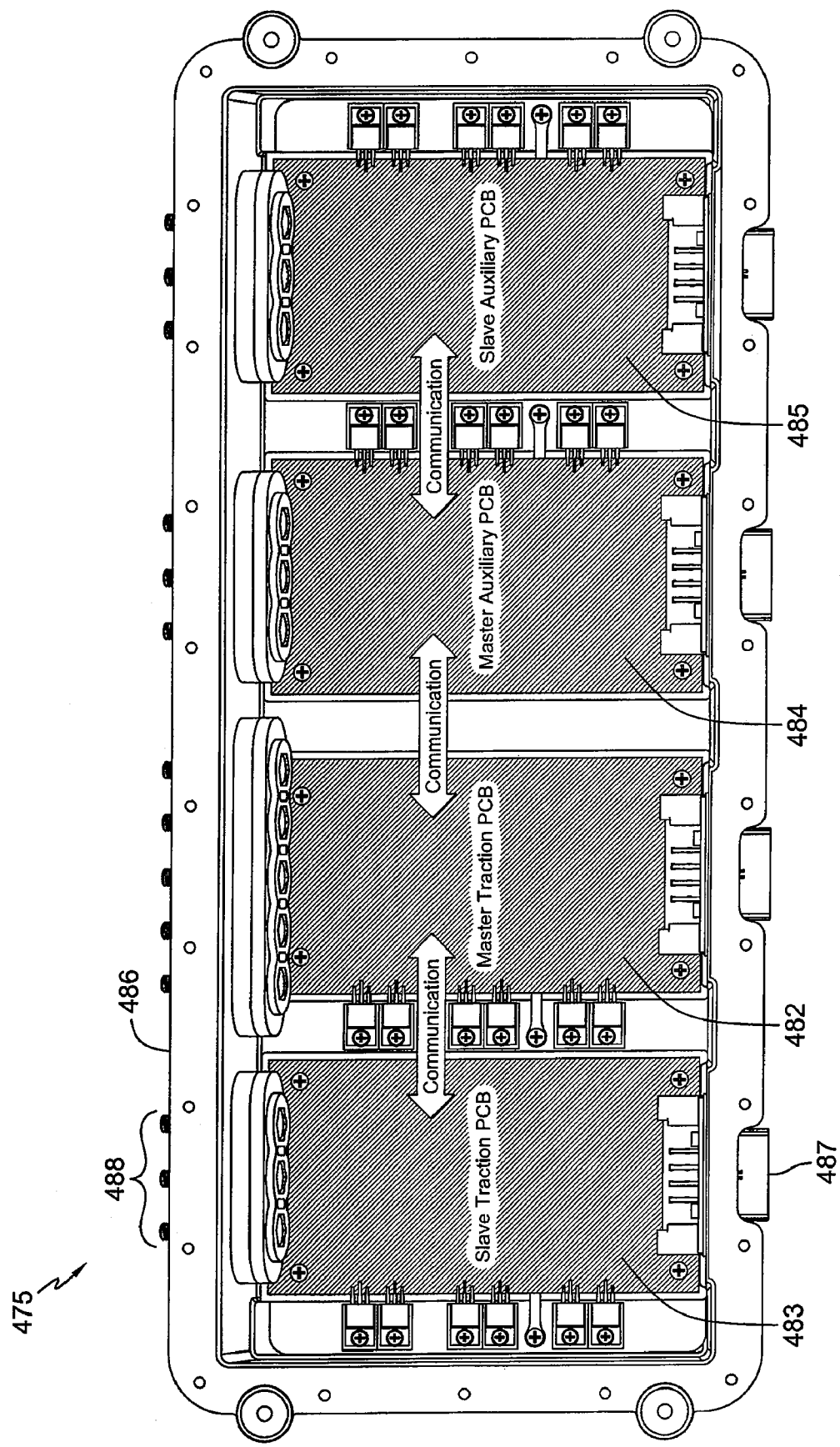
FIG. 15 is a plan view of a second embodiment of a controller assembly with the base plate removed to show parallel arrangement of printed circuit boards.

FIG. 15 illustrates a first embodiment of a controller assembly 475 housing multiple PCBs and capable of controlling multiple traction and deck motors. It should be noted that FIG. 15 is provided for exemplary purposes and may not illustrate all components of the controller assembly, such as inter-board connections, cables, or the like. In this instance, controller assembly 475 includes master auxiliary PCB 484 and slave auxiliary PCB 485 for controlling two auxiliary motors (not shown), and master traction PCB 482 and slave traction PCB 483 for controlling right and left traction motors (not shown). In this embodiment, the PCBs are arranged side by side within a single housing 486, which is similar to housing 441 of FIG. 12, except that it is elongated to accommodate the additional PCBs. Providing separate PCBs configured as such in a single housing provides an arrangement that facilitates serviceability and troubleshooting. Such an arrangement also provides improved cooling via the increased size and mass of the heat sink.

Housing 486 provides separate input connectors 487 and terminal posts 488 for each of the PCBs (482-485). Master traction PCB 482 connects to a larger (5-post) terminal block assembly as it provides the connection to the utility vehicle's onboard power supply. Electrical leads transmit data and power internally across the PCBs within the housing. Though shown in a particular layout, PCBs 482-485 could be positioned within the housing in any order. However, the illustrated layout minimizes electrical connections as it places the slave PCBs directly adjacent to their associated master PCBs. Other embodiments might have any reasonable number of traction or auxiliary PCBs. However, the scalability is limited by the dimensions of the particular housing 486.

Figure 16:
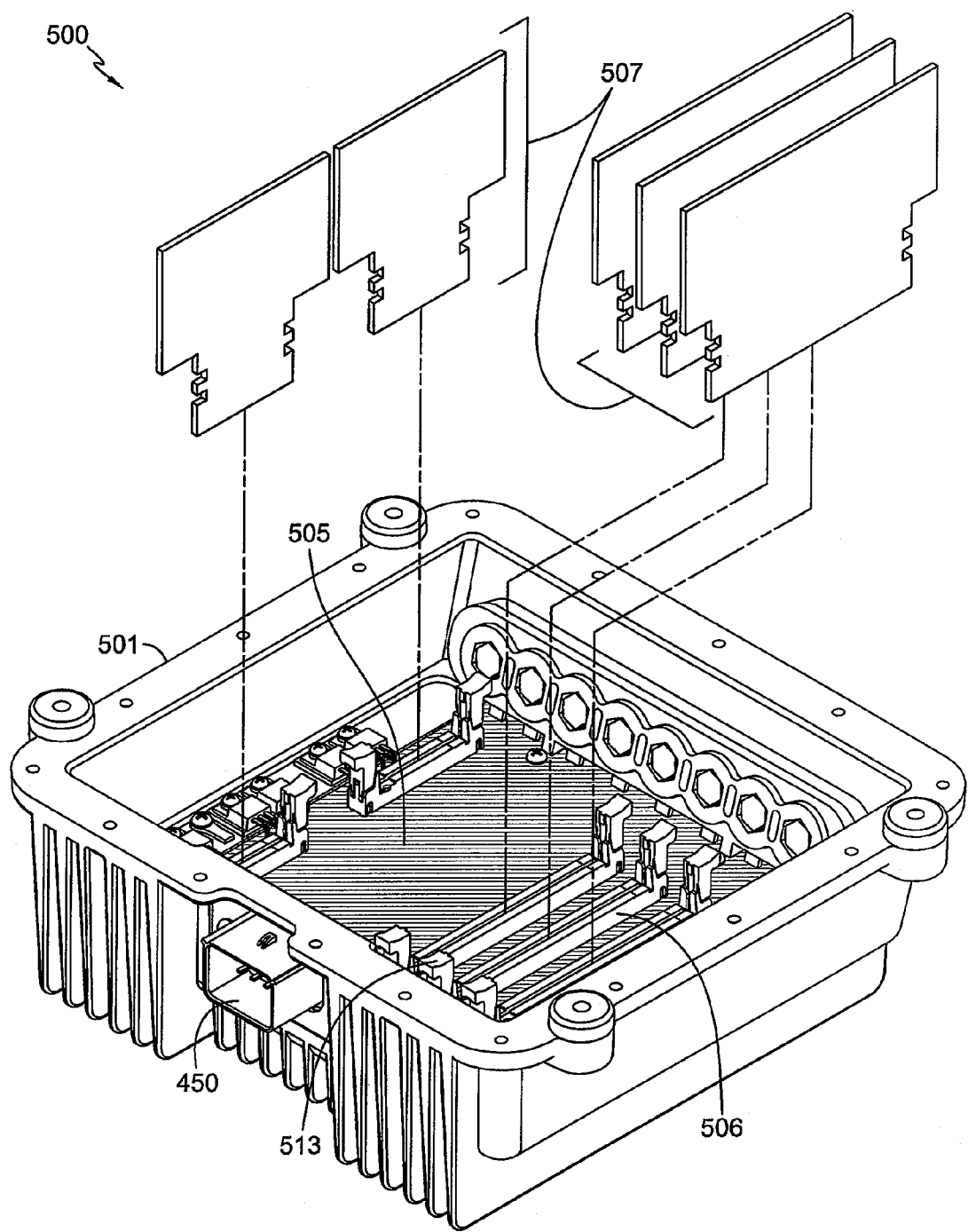
FIG. 16 is an exploded perspective view of a third embodiment of a controller assembly using expansion slots for installation of printed circuit boards.

FIG. 16 illustrates a second embodiment of a controller assembly for housing multiple PCBs that provides a smaller package and improved scalability. Controller assembly 500 includes a housing 501 that is similar to that shown in FIGS. 2-5. However, instead of a single PCB fixed to the inside of the housing, controller assembly 500 provides a motherboard 505 fixed to the housing, which includes a plurality of expansion slots 506 for accepting individual PCBs 507. Each expansion slot 506 includes locking tabs 513 for securing a PCB 507 in place. Seating the PCBs in the correct manner aligns and connects communication contacts within the motherboard 505 (not shown) allowing for communication between the various PCBs 507, and input/output between the PCBs 507 and the terminal block assembly and input connector. Not only does this embodiment provide for a smaller controller assembly than that of FIG. 15, it provides a single connection point via the motherboard for all communication with the controllers.

As shown in FIG. 16, motherboard 505 comprises five expansion slots 506 for supporting up to five PCBs 507. Such a controller assembly may be used to power multiple traction motors, multiple deck motors, and an additional auxiliary motor. While more expansion slots could be provided, there is a trade-off. As the number of expansion slots increases, the size of the controller assembly also increases, primarily due to heat transfer constraints on the assembly. The space between the expansion slots 506 is optimized to provide a sufficient air gap between the PCBs 507 to prevent overheating and allow for PCB 507 installation/replacement, while maintaining a minimal overall housing length. Ideally, the PCBs 507 that typically generate the most heat are positioned to the outside of the array to facilitate cooling. For example, deck motors on an electric mowing vehicle maintain relatively high running speeds and typically consume large amounts of power, and therefore generate large amounts of heat. Accordingly, these controller boards should be placed on the end positions of the array. Meanwhile, PCBs 507 associated with motors that are less frequently used or draw lower levels of power are preferably placed to the center of the array as they are likely to generate less heat in most cases. Heat is also managed through layout of the individual PCBs 507. Circuits and components that generate the most heat, such as MOSFETs or other switching devices or components, are disposed around the perimeter of the PCB and either on, or closer to, the housing 501 heat sink surfaces or base plate heat sink surfaces. The remaining construction of the controller assembly shown in FIG. 16 is similar to that in FIG. 14. After the various PCBs 507 are installed in their respective expansion slots 506, the base plate is secured to the housing to provide a seal.

Though a particular model of utility vehicle might have five or more expansion slots available within its controller assembly, not all of them would necessarily need to be utilized in a particular instance. Thus, this design provides for modularity and scalability. Functionality, in the form of additional motors and their respective PCBs, could be added or removed depending on the specific model requirements. In addition, the functionality of a particular model sold with unutilized expansion slots could be augmented after purchase without requiring a new controller assembly. This design also improves manufacturability in that a single controller assembly design could be used across all models regardless of drive train type or deck configuration (one or multiple deck motors). In this design, modifications would be would be made within a given controller assembly.

Another advantage to such a design is the ease with which specific auxiliary functions could be substituted. A spare expansion slot could be used to enable a plug-and-play capability by supporting any one of various PCBs 507, each specifically tailored and pre-programmed to control a different implement such as a snow thrower, a blower, a winch, a tiller, etc. For instance, such PCBs would be programmed to operate at certain speeds to accommodate the anticipated loads of their respective implements. Such PCBs could also be automatically recognized by the motherboard 505.

The controller assembly of FIG. 16 could be altered in other embodiments such that PCBs 507 are mounted in a variety of other ways, such as with trays, tracks or mounting brackets secured inside the housing with support features to hold and support the PCBs 507. Alternatively, the motherboard 505 (with expansion slots 506 for attaching the various PCBs 507) could be mounted to the base plate (not shown). In addition, the PCBs 507 could be stacked vertically and/or be attached to a vertical motherboard. They could also be arranged in other configurations on the motherboard 505.

Figure 17:
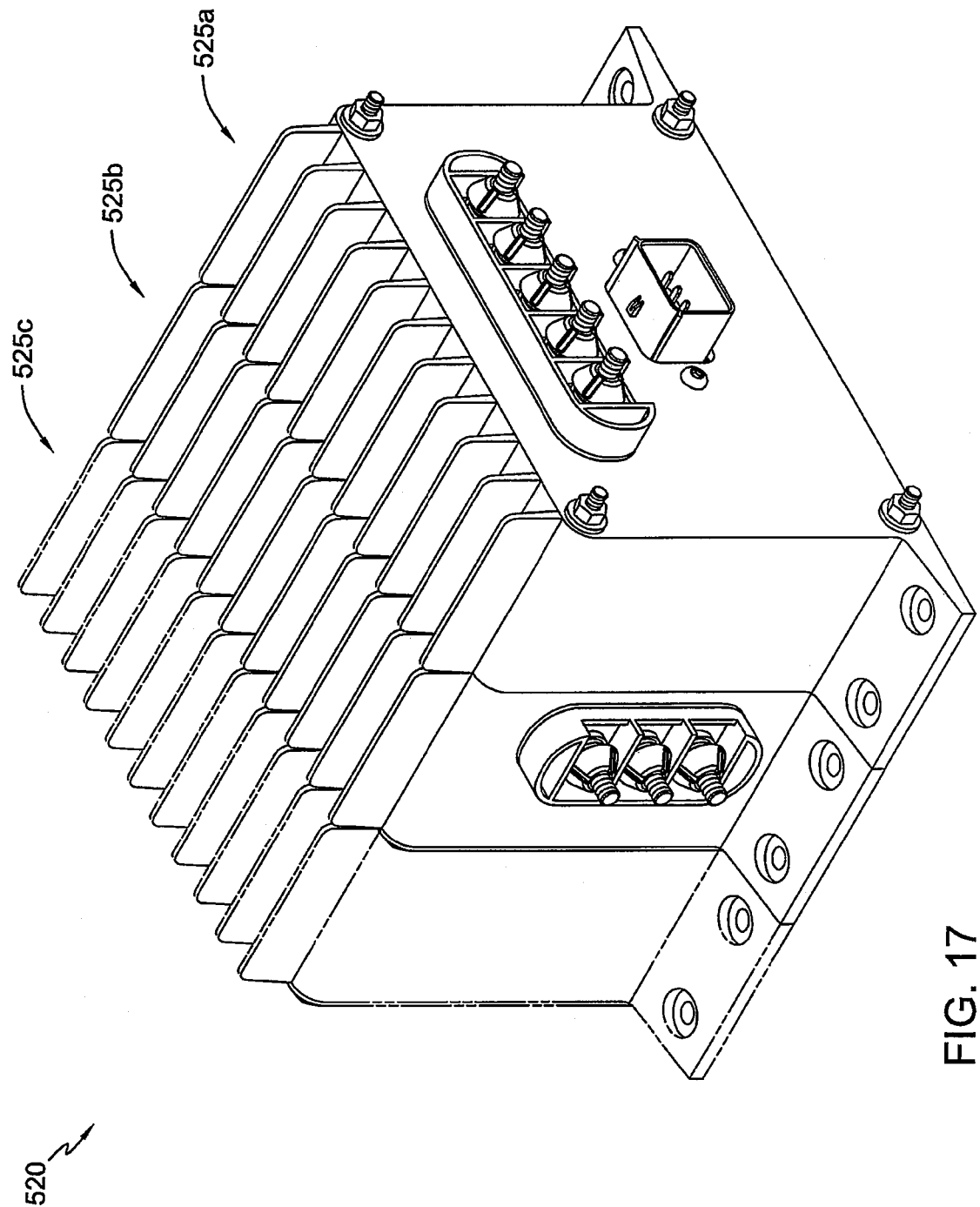
FIG. 17 is a perspective view of a fourth embodiment of a controller assembly of the present invention.
Figure 18:
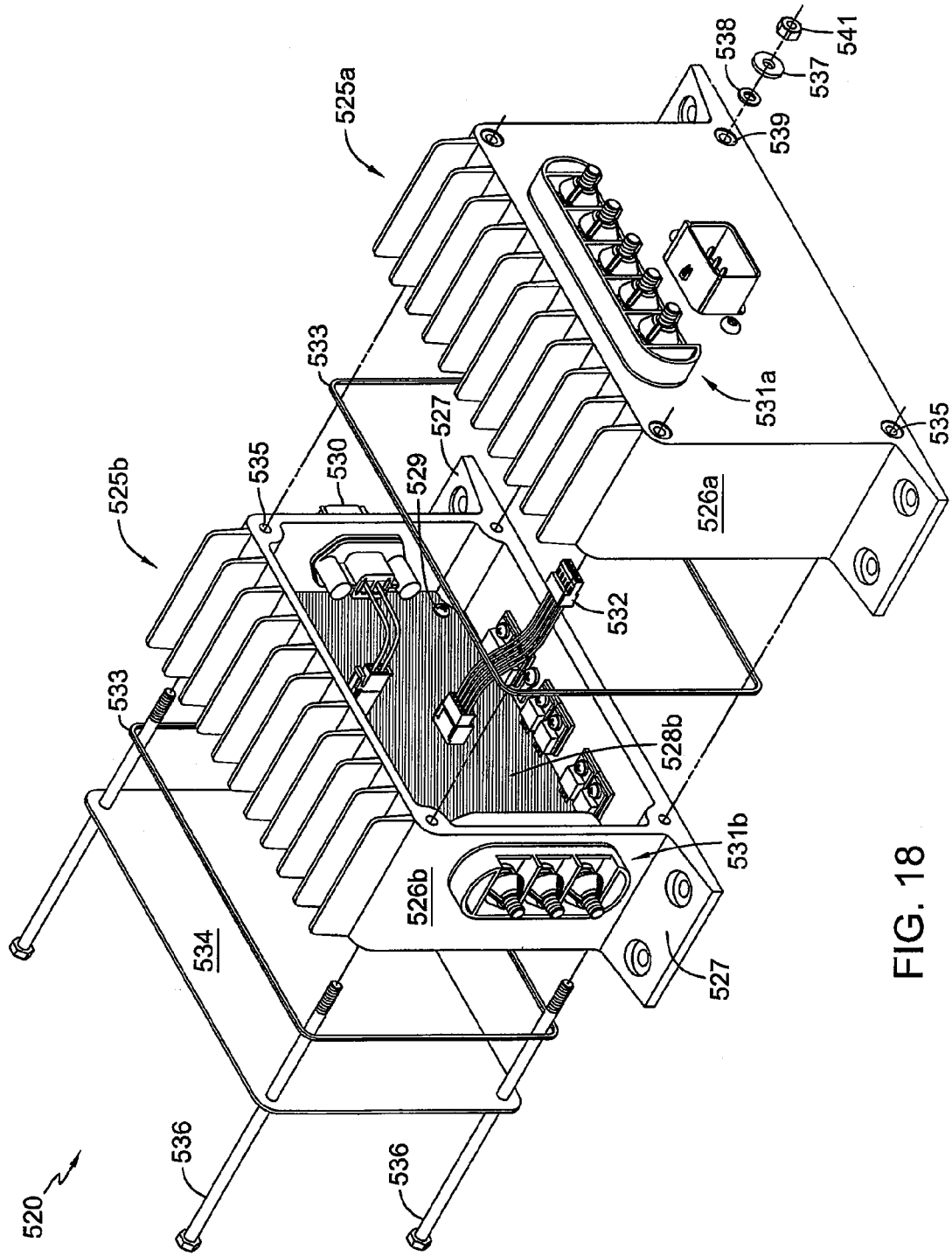
FIG. 18 is an exploded perspective view of the controller assembly of FIG. 17.

FIGS. 17 and 18 illustrate an additional embodiment of a controller assembly for housing multiple PCBs. In this embodiment, the sealed housing and base plate arrangement of prior embodiments is replaced by modular controller assembly 520, which is formed by combining various PCB subassemblies or modules, such as subassemblies 525a and 525b. Each such subassembly includes an individual PCB mounted in an individual housing member such as 526a and 526b. This controller assembly embodiment facilitates stacking together a variety of individually-housed PCBs to form a controller assembly 520 with variable functionality. An additional PCB subassembly 525c is shown in phantom to represent one or more additional subassemblies which may be added to modify and expand functionality of controller assembly 520.

FIG. 18 shows an exploded view of controller assembly 520. PCB 528b is mounted within an intermediate housing member 526b having open ends, which provide access to an interior space of the housing 526b. The housing 526b includes integral lands or mounting brackets to facilitate assembly. PCB 528a (not shown) is mounted within an interior space of an end housing member 526a having one open end. As shown in FIG. 18, the controller assembly 520 accommodates at least one end housing 526a and at least one intermediate housing 526b. A backing plate 534 provides closure to the open end of intermediate housing 526b opposite the end that mates with the open end of housing 526a. In additional embodiments, two or more intermediate housings 526b may be disposed between the backing plate 534 and the end housing 526a. In yet other embodiments, one or more intermediate housings 526b may be disposed between two end housings 526a, which provide end closure to the assembly 520 without the need for a backing plate. Between each housing member 526a, 526b, etc., is a seal 533, which may take the form of recessed gaskets, surface-mounted gaskets, liquid sealants, etc. Thus, as individual housing members are positioned in parallel and fixed in place, a sealed outer casing is formed from the various housing members so as to protect the PCBs within the controller assembly 520 that is formed. Each PCB housing member also includes heat dissipation fins and integrally formed foot-style mounting flanges 527 for securing each individual housing member to the utility vehicle mounting surface.

As no motherboard is present in this embodiment, communication and power connections may be made through a series of cable assemblies, such as cable assemblies 532, which may be plugged into adjacent PCBs (as shown) or passed through an opening (not shown) in an adjacent housing member to a PCB module downstream. Other methods of employing interboard connections known in the art may also be employed. Each PCB subassembly 525 provides a weather resistant connector 530 for sensor and signal input to the PCB and a terminal block assembly 531 for 3-phase power connections from the PCB to the controlled motor. One of the external housing members, such as housing member 526a in FIG. 18, will provide additional terminals for creating a circuit with the utility vehicle's onboard power source.

The housing members 526 are formed of a suitable material to allow for sufficient thermal conduction and durability. Each housing member 526 comprises a plurality of openings 535 for receiving fasteners 536 to join modules 525a and 525b together to form controller assembly 520. Fasteners 536 are of any appropriate size and length needed to join all of the desired PCB modules together into a stack. To ensure the stack remains joined together and sealed, a rigid back-up washer 537 compresses a sealing washer or o-ring 538 seated on a spotface 539 machined at each opening 535 on the exterior face of exterior housing member 526a. Similar sealing is also utilized under the head of each fastener 536. Optionally, gaskets (not shown) with a hole pattern to receive fasteners 536 could be used in place of seals 533 to seal both the end plate 534 perimeter and fastener holes, as well as the joints between housing members, thereby eliminating the need for certain machined sealing features. The length of controller assembly 520 will vary depending on the number of subassemblies 525 included. In lieu of the fasteners 536 shown in the figures, the subassemblies may be joined by screws, snap features, locking mechanisms, or the like. Each subassembly 525 is preferably bolted in place by its mounting flanges 527.

Just as with the embodiment described in reference to FIG. 16, the PCB modules may be arranged such that PCBs generating the most heat are disposed at the ends of the stack. Furthermore, heat generating elements of the circuits on each PCB may be located along the PCB edge adjacent to the base (or other portion of the housing member 526 serving as a heat sink). The base, including mounting flanges 527, may be enlarged and/or thickened to provide more material and surface area for serving as a heat sink and improving heat transfer when mounted to a vehicle.

Figure 19:
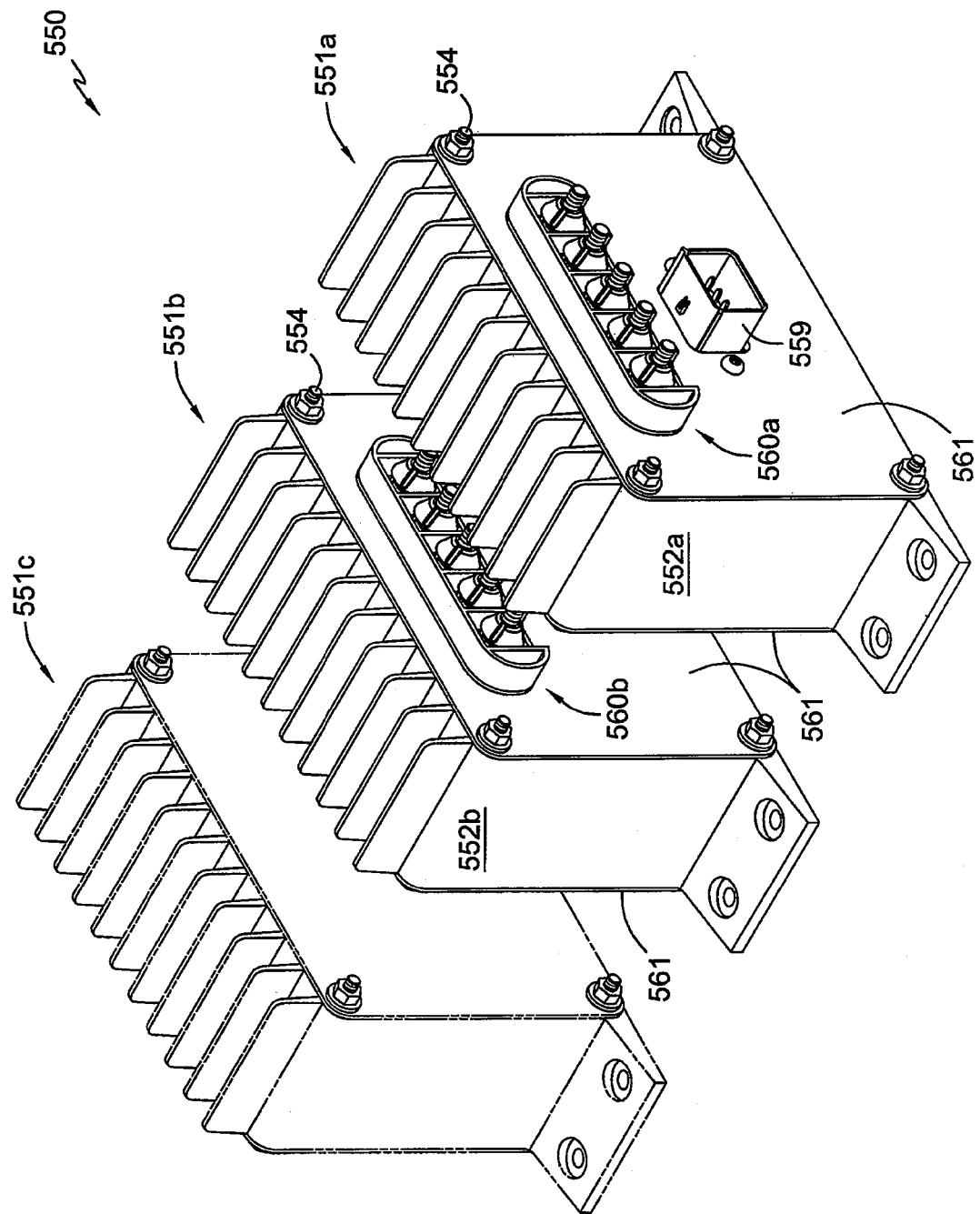
FIG. 19 is a perspective view of a fifth embodiment of a controller assembly of the present invention.

FIG. 19 shows a variation of the modular controller assembly 520 where the individual subassemblies have been separated and independently housed. Controller module array 550 consists of individual controller assemblies or modules 551. PCBs (not shown) are enclosed within finned, frame-like housing members 552. Each housing member has an end plate 561 secured to each side, preferably with fasteners, such as bolts 554 or with other suitable vibration-proof fasteners/fastening methods. End plates 561 are sealed to housing members 552a, 552b, etc., with gaskets (not shown) comprising a perimeter seal and a hole pattern to receive bolts 554. In this embodiment, the communication between the controller modules and their enclosed PCBs would be carried through external wiring harnesses or cables to connectors such as connector 559 mounted on housing members 552 or end plates 561. Terminal block assemblies 560 attach to housing members 552 to provide 3-phase power connections and battery power connections as needed. To further simplify the PCBs housed in the individual controller modules 551, a main power module (not shown) enclosed in the same or similar housing form (or in a different housing form) could be provided to make available the voltages (for example, 3.3V, 5V, 12V, 15V & 48V) required for the different drives and processors to drive each PCB. This would facilitate improved convection cooling ability of the individual control modules 551.

The modular designs illustrated in FIGS. 17-19 provide considerable controller and vehicle configuration flexibility as the individual PCB modules can be arranged in various ways and PCB modules may be added or removed from the controller assembly without requiring expensive additional hardware or redesign. The controller array 550 of FIG. 19 has a further advantage of relatively small package size of individual modules which may be easier to position on a vehicle than larger controller assemblies. Furthermore, expansion of controller functionality is not limited by the number of available expansion slots in these embodiments.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any equivalent thereof.

What is claimed is:

1. A controller assembly for controlling first and second electric motors of a utility vehicle, the first electric motor for powering a traction drive of the utility vehicle and the second electric motor for powering an auxiliary function of the utility vehicle, the controller assembly comprising:

a plurality of controller boards each having at least one associated connector in communication with one of the first or second electric motors of the utility vehicle, at least one of the plurality of controller boards configured to control the first electric motor, and at least one of the plurality of controller boards configured to control the second electric motor; and a housing having mounting features to facilitate mounting to the vehicle and comprising a plurality of individual housing members each containing at least one of the plurality of controller boards, the individual housing members connectable to each other to collectively define an enclosed interior space.

2. The controller assembly of claim 1, wherein at least one of the individual housing members comprises a motherboard having a plurality of expansion slots each configured to accept one of the plurality of controller boards.

3. The controller assembly of claim 1, wherein the plurality of controller boards comprises a master traction controller board, a slave traction controller board, a master auxiliary controller board, and a slave auxiliary controller board.

4. The controller assembly of claim 1, wherein the individual housing members comprise at least one end housing member having one open side.

5. The controller assembly of claim 4, wherein the individual housing members further comprise one intermediate housing member having two open sides, each of the open sides configured to mate with either the open side of the at least one end housing member or a backing plate.

6. The controller assembly of claim 4, wherein the individual housing members comprise at least two intermediate housing members each having two open sides, each of the open sides configured to mate with either the open side of the at least one end housing member, one of the open sides of another of the at least two intermediate housing members, or a backing plate.

7. The controller assembly of claim 1, wherein the housing comprises two end housing members and at least one intermediate housing member, the end housing members each having one open end configured to mate with the at least one intermediate housing member, and the at least one intermediate housing member having two open ends, the two open ends configured to mate with either the open end of one of the two end housing members or one of the two open ends of another intermediate housing member.

8. The controller assembly of claim 1, wherein the housing comprises an end housing member, at least one intermediate housing member, and a backing plate connectable to each other to collectively define the enclosed interior space of the housing.

9. The controller assembly of claim 8, further comprising a plurality of fasteners each configured to collectively connect the individual housing members and the backing plate together.

10. A controller assembly for controlling a plurality of electric motors of a mowing vehicle, the assembly comprising:
  at least a first controller board configured to control a first electric motor of the plurality of electric motors for powering a traction drive of the mowing vehicle and having at least one connector in communication with the first electric motor; and
  at least a second controller board configured to control a second electric motor for powering mower blades of the mowing vehicle and having at least one connector in communication with the second electric motor; and
  a housing defining an enclosed interior space and having mounting features to facilitate mounting to the mowing vehicle, wherein the housing comprises a plurality of individual housing members connectable to each other to collectively form the housing, each individual housing member containing at least one controller board.

11. The assembly of claim 10, further comprising at least one additional controller board disposed within the enclosed interior space of the housing and configured to control a third electric motor for powering an additional traction drive of the mowing vehicle and having at least one connector that penetrates the housing to allow connection to at least one additional signal line in communication with the third electric motor.

12. The controller assembly of claim 10, wherein at least one of the individual housing members comprises a motherboard having a plurality of expansion slots each configured to accept one of the first and second controller boards.

13. The controller assembly of claim 10, wherein one of the plurality of individual housing members includes a backing plate.

14. The controller assembly of claim 10, further comprising a plurality of sealing gaskets each disposed between two of the plurality of individual housing members.

15. An expandable controller assembly for controlling a plurality of electric motors of a utility vehicle, the assembly comprising:
  a plurality of individual housing members connected together to collectively define an enclosed interior space, at least one of the individual housing members having mounting features to facilitate mounting of the controller assembly to the vehicle; and
  a plurality of controller boards, each controller board mounted within one of the plurality of individual housing members and associated with at least one connector that penetrates the controller assembly to allow connection to a signal line in communication with at least one of the plurality of electric motors of the vehicle;
  wherein individual housing members can be added to or subtracted from the expandable controller assembly to redefine the volume of the enclosed interior space.

16. The controller assembly of claim 15, wherein at least one of the plurality of controller boards is configured to control at least one of the plurality of electric motors powering a traction drive of the vehicle, and at least one of the plurality of controller boards is configured to control at least one of the plurality of electric motors powering an auxiliary function of the utility vehicle.

17. A modular controller assembly for controlling a plurality of electric motors of a utility vehicle, the assembly comprising:
  a plurality of individual controller modules electrically connected together, each individual controller module defining a housing with at least one controller board mounted therein and having mounting features to facilitate mounting of the individual controller module to the utility vehicle, each module having a connector to allow connection of the at least one controller board to a signal line in communication with at least one of the plurality of electric motors of the vehicle;
  wherein the plurality of individual controller modules are mounted at separate locations on the utility vehicle.

18. The modular controller assembly of claim 17, wherein at least one of the individual controller modules is configured to control at least one of the plurality of electric motors powering a traction drive of the utility vehicle, and at least one of the individual controller modules is configured to control at least one of the plurality of electric motors powering an auxiliary function of the utility vehicle.

* * * * *